(12) United States Patent
Han et al.

(10) Patent No.: US 12,710,536 B2
(45) Date of Patent: Aug. 18, 2026

(54) SURFACE-EMITTING LASER DEVICE AND DISTANCE MEASUREMENT DEVICE HAVING SAME

(71) Applicant: LG INNOTEK CO., LTD., Seoul (KR)

(72) Inventors: Sang Heon Han, Seoul (KR); Kang Yeol Park, Seoul (KR); Jae Hoon Lee, Seoul (KR); Yong Gyeong Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 975 days.

(21) Appl. No.: 17/912,306

(22) PCT Filed: Mar. 17, 2021

(86) PCT No.: PCT/KR2021/003302
§ 371 (c)(1),
(2) Date: Sep. 16, 2022

(87) PCT Pub. No.: WO2021/187891
PCT Pub. Date: Sep. 23, 2021

(65) Prior Publication Data

US 2023/0132771 A1 May 4, 2023

(30) Foreign Application Priority Data

Mar. 18, 2020 (KR) ........................ 10-2020-0033040
Mar. 31, 2020 (KR) ........................ 10-2020-0039354

(51) Int. Cl.
*H01S 5/42* (2006.01)
*G01S 7/481* (2006.01)
*G01S 7/4865* (2020.01)
*G01S 17/89* (2020.01)

(52) U.S. Cl.
CPC ............ *G01S 17/89* (2013.01); *G01S 7/4815* (2013.01); *G01S 7/4865* (2013.01); *H01S 5/423* (2013.01)

(58) Field of Classification Search
CPC ............................... H01S 5/423; G01S 7/4815
See application file for complete search history.

(56) References Cited

U.S. PATENT DOCUMENTS 8,483,254 B2 7/2013 Harasaka et al.
8,649,407 B2 2/2014 Harasaka et al.
8,958,449 B2 2/2015 Harasaka et al.
9,368,691 B2 6/2016 Moon et al.
(Continued)

FOREIGN PATENT DOCUMENTS

CN 102224646 A 10/2011
CN 105098041 A 11/2015
(Continued)

*Primary Examiner* — Michael Carter
(74) *Attorney, Agent, or Firm* — Birch, Stewart, Kolasch & Birch, LLP

(57) ABSTRACT

A surface-emitting laser device disclosed in an embodiment of the invention includes a first region in which a plurality of first emitters is arranged; and a second region in which a plurality of second emitters is arranged, an area of the second region is smaller than an area of the first region, and the second region is disposed in a center region of the first region, and the first emitter and the second emitter may be driven separately.

15 Claims, 14 Drawing Sheets

(56) References Cited

U.S. PATENT DOCUMENTS

| | | | | |
|---|---|---|---|---|
| 10,453,901 | B2 | 10/2019 | Kim et al. | |
| 10,686,018 | B2 | 6/2020 | Kim et al. | |
| 10,705,109 | B2 | 7/2020 | Jang et al. | |
| 11,398,716 | B2 | 7/2022 | Hegblom | |
| 11,762,068 | B2 | 9/2023 | Donovan | |
| 2002/0101899 | A1* | 8/2002 | Yokouchi | H01S 5/18313 372/46.013 |
| 2017/0307736 | A1* | 10/2017 | Donovan | G01S 17/10 |
| 2018/0267663 | A1 | 9/2018 | Cho et al. | |
| 2019/0033429 | A1 | 1/2019 | Donovan | |
| 2019/0056497 | A1 | 2/2019 | Pacala et al. | |
| 2020/0200874 | A1 | 6/2020 | Donovan | |
| 2021/0028604 | A1 | 1/2021 | Jung et al. | |
| 2021/0336419 | A1 | 10/2021 | Choi et al. | |
| 2021/0356564 | A1* | 11/2021 | Burroughs | G01J 1/44 |

FOREIGN PATENT DOCUMENTS

| | | | |
|---|---|---|---|
| CN | 109073757 | A | 12/2018 |
| CN | 109427855 | A | 3/2019 |
| JP | 2000-12973 | A | 1/2000 |
| JP | 2006-302981 | A | 11/2006 |
| JP | 2017-98532 | A | 6/2017 |
| KR | 10-1994-0011331 | B1 | 12/1994 |
| KR | 10-2018-0104970 | A | 9/2018 |
| KR | 10-2018-0128447 | A | 12/2018 |
| KR | 10-2019-0040915 | A | 4/2019 |
| KR | 10-2019-0115406 | A | 10/2019 |
| KR | 10-2019-0133382 | A | 12/2019 |
| KR | 10-2050677 | B1 | 12/2019 |

* cited by examiner (A)

(B)

270
220
210
215
y
x
F1
250
290
292
294
230
202
240
242
241
270
242
P2
287
D5
250
280
282
284
230
201
240
242
241
270
242
P1

SURFACE-EMITTING LASER DEVICE AND DISTANCE MEASUREMENT DEVICE HAVING SAME

CROSS REFERENCE TO RELATED APPLICATIONS

This application is the National Phase of PCT International Application No. PCT/KR2021/003302, filed on Mar. 17, 2021, which claims priority under 35 U.S.C. 119(a) to Patent Application No. 10-2020-0033040, filed in the Republic of Korea on Mar. 18, 2020 and Patent Application No. 10-2020-0039354, filed in the Republic of Korea on Mar. 31, 2020, all of which are hereby expressly incorporated by reference into the present application.

TECHNICAL FIELD

An embodiment of the invention relates to a surface-emitting laser device and a distance measurement device having the same.

BACKGROUND ART

A sensor for depth determination based on a semiconductor laser has been developed. One technique for using these sensors is the time-of-flight technique. The time-of-flight technique requires accurate detection of the delay between the transmitted and received light pulses to measure the distance. In general, the delay is detected based on the time difference between the time of the transmitted light pulse and the time of the received light pulse (i.e., the time-delay between the transmitted light pulse and the received light pulse), and the distance to the object may be determined based on the delay (e.g., since the speed of light is known). Images may be generated based on determining distances for various locations in the field of view. A light source generating a light pulse of a specific wavelength is capable of oscillating in a single longitudinal mode of a narrow spectrum, and has a high coupling efficiency due to a small radiation angle of the beam. Research into a technology for manufacturing a light source matrix by patterning such a light source in the form of a two-dimensional array is active. By irradiating light pulses to an object in the form of a two-dimensional array and analyzing the reflected light pulses through a processor, a three-dimensional image and distance of the object can be extracted.

DISCLOSURE

Technical Problem

An embodiment of the invention provides a surface-emitting laser device having different regions or areas of a plurality of light emitting portions that irradiate light toward an object. An embodiment of the invention provides a surface-emitting laser device having a first light emitting portion in the entire region and a second light emitting portion in a partial region for irradiating light toward the object. An embodiment of the invention may provide a surface-emitting laser device having a first light emitting portion that emits light through the entire region and a second light emitting portion that emits light from a center region. An embodiment of the invention may provide a surface-emitting laser device having a plurality of light emitting portions that irradiate light of different angles of view toward the object.

An embodiment of the invention may provide a surface-emitting laser device in which a connection portion or a bridge electrode of the second emitter is disposed to overlap the connection portion of the first emitter to connect the second emitter and the second pad. An embodiment of the invention may provide a surface-emitting laser device in which a connection portion or a bridge electrode is extended through the outside of the protruding portions of the first and second emitters in order to connect the second emitter and the second pad. An embodiment of the invention may provide a surface-emitting laser device having a plurality of light emitting portions that irradiate light of different angles of view toward a target. An embodiment of the invention may provide a surface-emitting laser device having a plurality of light emitting portions and a distance measurement device having the same.

Technical Solution

A surface-emitting laser device according to an embodiment of the invention includes a first region in which a plurality of first emitters are arranged; and a second region in which a portion of the plurality of first emitters and a plurality of second emitters are arranged, wherein an area of the second region is smaller than an area of the first region, and the second region is disposed in a center region of the first region, and the first emitter and the second emitter may be driven separately.

According to an embodiment of the invention, the number of the second emitters disposed in the second region may be smaller than the number of the first emitters disposed in the first region. a first pad disposed outside the first region in which the first emitters are arranged and electrically connected to the plurality of first emitters; and a second pad is disposed outside the first region and electrically connected to the second emitters may include. A pitch between adjacent first emitters in the first region may be the same as a pitch between adjacent second emitters in the second region. The second region may be arranged with the second emitters, and pitches of the first and second emitters in the first region and the second region may be the same.

According to an embodiment of the invention, a first insulating layer disposed between the first connection portion and the second connection portion on the second region may include, wherein the second pad is disposed on a portion of an outside of the first region and has an area smaller than the area of the first pad, and is electrically connected to the plurality of second emitters, wherein each of the first and second emitters may include a light emitting layer disposed on a lower first reflective layer, respectively, an oxide layer having an opening on the light emitting layer, a second reflective layer on the oxide layer, and a passivation layer on the second reflective layer.

According to an embodiment of the invention, the first emitter includes a first contact portion in contact with the second reflective layer of the first emitter, and a first electrode including the first connection portion extending from the first contact portion to the passivation layer, wherein the second emitter may include a second contact portion in contact with the second reflective layer of the second emitter, and the second connection portion extending from the second contact portion to the passivation layer.

According to an embodiment of the invention, the second region includes a first flat portion disposed between the protruding portions of the first and second emitters, and the protruding portions of the first and second emitters include the light emitting layer, the oxide layer and the second reflective layer, wherein the first connection portion of the first electrode and the second connection portion of the second electrode may overlap a portion of the first flat portion in a vertical direction.

According to an embodiment of the invention, a third region in which a bridge electrode connecting the second electrode to the second pad is disposed between the second region and the second pad, wherein the bridge electrode extends outside the protrusions of the plurality of first emitters disposed in the third region, and the third region includes a second flat portion extending outside of the protruding portion of the first emitter, and the first connection portion of the electrode and the bridge electrode of the second electrode on the second flat portion overlap in a vertical direction, and the first insulating layer is disposed between the upper surface of the first connection portion of the first electrode and the lower surface of the bridge electrode, and a second insulating layer for protecting the outside of the bridge electrode of the electrode may be included.

A surface-emitting laser device according to an embodiment of the invention includes a plurality of first emitters disposed in a first region and a second region; a plurality of second emitters disposed in the second region, wherein the second region is included in the first region, has a smaller area than the first region, and may be driven separately the plurality of first emitters and the plurality of emitters, wherein a pitch between the first emitter and the second emitter may be smaller than a pitch between the first emitters.

According to an embodiment of the invention, in the second region, the second emitters disposed in the second region may be respectively disposed between the first emitters. A pitch between adjacent first and second emitters in the second region may be ½ of a pitch between adjacent first emitters. Each of the first emitters disposed in the first region includes a first electrode on an upper portion of the first emitter, each of the second emitters disposed in the second region includes a second electrode on an upper portion of the second emitter, and the second electrode of the second emitter may include a bridge electrode connected to the second pad, and the bridge electrode may extend over the first region to the second pad. Each of the first and second emitters includes a lower electrode; a substrate on the lower electrode; a first reflective layer disposed on the substrate; a light emitting layer disposed on the first reflective layer; an oxide layer including an opening and an insulating region on the light emitting layer; a second reflective layer disposed on the oxide layer; and a passivation layer on the second reflective layer, wherein the first electrode or the second electrode may include a contact portion in contact with the second reflective layer and a connection portion extending on the passivation layer.

A surface-emitting laser device according to an embodiment of the invention includes: a first light emitting portion in which a plurality of first emitters irradiating light in an infrared region are arranged and have O rows and P columns; at least one second light emitting portion in which a plurality of second emitters for irradiating infrared light are arranged and have M rows and N columns; An area of a second region in which the second emitters are disposed is smaller than an area of a first region, and the number of the second emitters disposed in the second region is smaller than the number of the first emitters disposed in the first region, the second region is disposed in the center region of the first region, the first emitter and the second emitter are driven separately, and O, P, M, N are integers; and have a relationship of O>P>M>N.

According to an embodiment of the invention, the first light emitting portion may emit light for a reference angle of view, and the second light emitting portion may emit light for a smaller angle of view than the reference angle of view. The reference angle of view may be greater than or equal to 70 degrees, and the angle of view smaller than the reference angle of view may be less than or equal to 50 degrees.

According to an embodiment of the invention, the first emitter and the second emitter are repeatedly driven on/off with a predetermined period, and the driving period of the first emitter at the reference angle of view may be smaller than the driving period of the second emitter at the angle of view smaller than the reference angle of view. An area of the second region may be 30% or less of an area of the first region, and the second region may be disposed in a polygonal shape with respect to the centers of the first and second regions. The second light emitting portion may have the second emitter having a zoom magnification of 2× or more.

A distance measurement device according to an embodiment of the invention includes: a light source having the surface-emitting laser device disclosed above; and a light receiving portion configured to receive light scattered or reflected from an object by driving the first or second light emitting portion of the light source to emit light in the irradiated infrared region.

Advantageous Effects

The surface-emitting laser device according to an embodiment of the invention may reduce the power consumption of the camera module by individually driving the first light emitting portion and the second light emitting portion partially emitting light within the region of the first light emitting portion. According to the surface-emitting laser device according to the embodiment of the invention, by selectively emitting light from a plurality of light emitting portions having different areas, the light emitting portions may be selectively driven according to a zoom function or a measurement distance. According to the surface-emitting laser device according to the embodiment of the invention, there is an effect of selectively emitting light from the first light emitting portion that emits light through the entire region and the second light emitting portion that emits light through the partial or center region.

According to the surface-emitting laser device according to the embodiment of the invention, the connection portion or the bridge electrode of the second emitter extends to the outside of the protruding portion part of the first and second emitters, so that the connection resistance is not increased and the operating voltage may be suppressed from increasing. In addition, it is possible to spread the current, thereby improving the operating voltage of the second emitter. In addition, since the connecting portion or the bridge electrode of the second emitter id disposed to overlap the first electrode of the first emitter, light loss may be reduced.

The surface-emitting laser device and the distance measurement device having the same according to an embodiment of the invention may have improve reliability. The surface-emitting laser device may be applied as a distance measurement device to a moving object such as a vehicle, a portable terminal, a camera, various information measurement devices, robots, computers, medical devices, home appliances or wearables.

BEST MODE

Hereinafter, preferred embodiments of the present invention will be described in detail with reference to the accompanying drawings. However, the technical spirit of the invention is not limited to some embodiments to be described, and may be implemented in various other forms, and one or more of the components may be selectively combined and substituted for use within the scope of the technical spirit of the invention. In addition, the terms (including technical and scientific terms) used in the embodiments of the invention, unless specifically defined and described explicitly, may be interpreted in a meaning that may be generally understood by those having ordinary skill in the art to which the invention pertains, and terms that are commonly used such as terms defined in a dictionary should be able to interpret their meanings in consideration of the contextual meaning of the relevant technology. Further, the terms used in the embodiments of the invention are for explaining the embodiments and are not intended to limit the invention. In this specification, the singular forms also may include plural forms unless otherwise specifically stated in a phrase, and in the case in which at least one (or one or more) of A and (and) B, C is stated, it may include one or more of all combinations that may be combined with A, B, and C. In addition, in describing the components of the embodiments of the invention, terms such as first, second, A, B, (a), and (b) may be used. Such terms are only for distinguishing the component from other component, and may not be determined by the term by the nature, sequence or procedure etc. of the corresponding constituent element. And when it is described that a component is "connected", "coupled" or "joined" to another component, the description may include not only being directly connected, coupled or joined to the other component but also being "connected", "coupled" or "joined" by another component between the component and the other component. In addition, in the case of being described as being formed or disposed "above (on)" or "below (under)" of each component, the description includes not only when two components are in direct contact with each other, but also when one or more other components are formed or disposed between the two components. In addition, when expressed as "above (on)" or "below (under)", it may refer to a downward direction as well as an upward direction with respect to one element.

Figure 1:
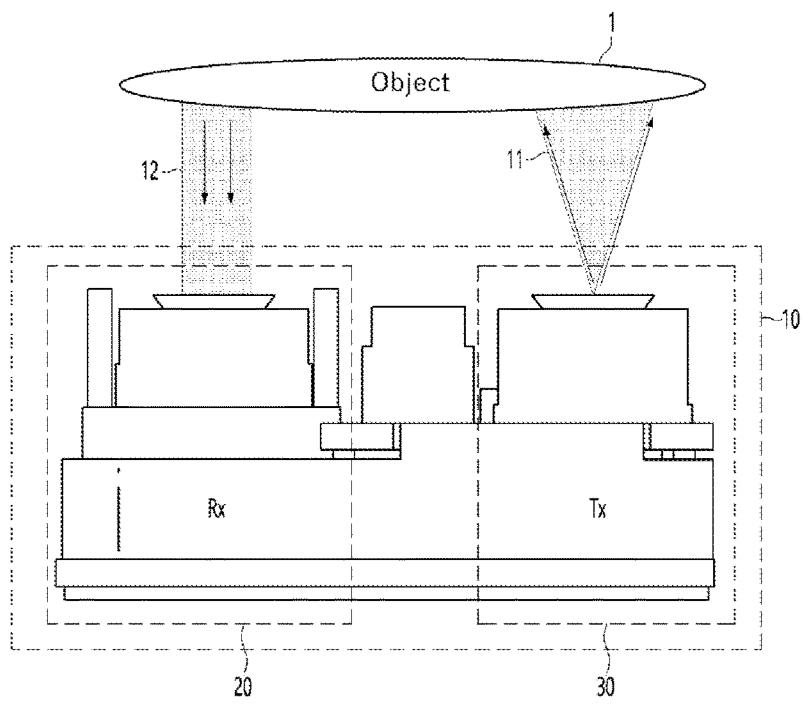
FIG. 1 is a conceptual diagram illustrating a distance measurement device according to an embodiment of the invention.
Figure 2:
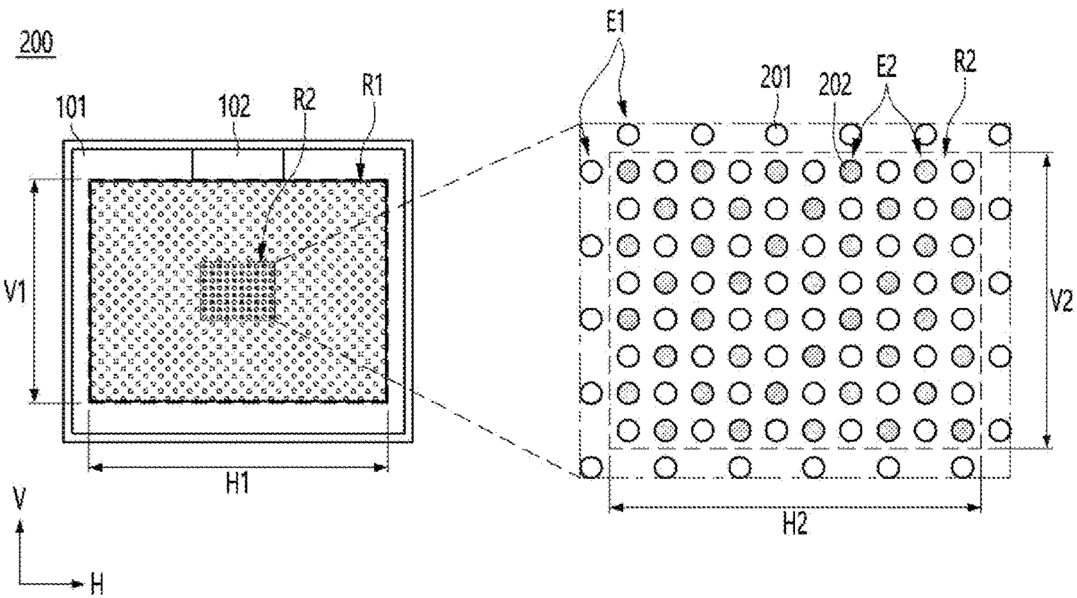
FIG. 2 is a plan view of a surface-emitting laser device in a light source in the distance measurement device of FIG. 1.
Figure 3:
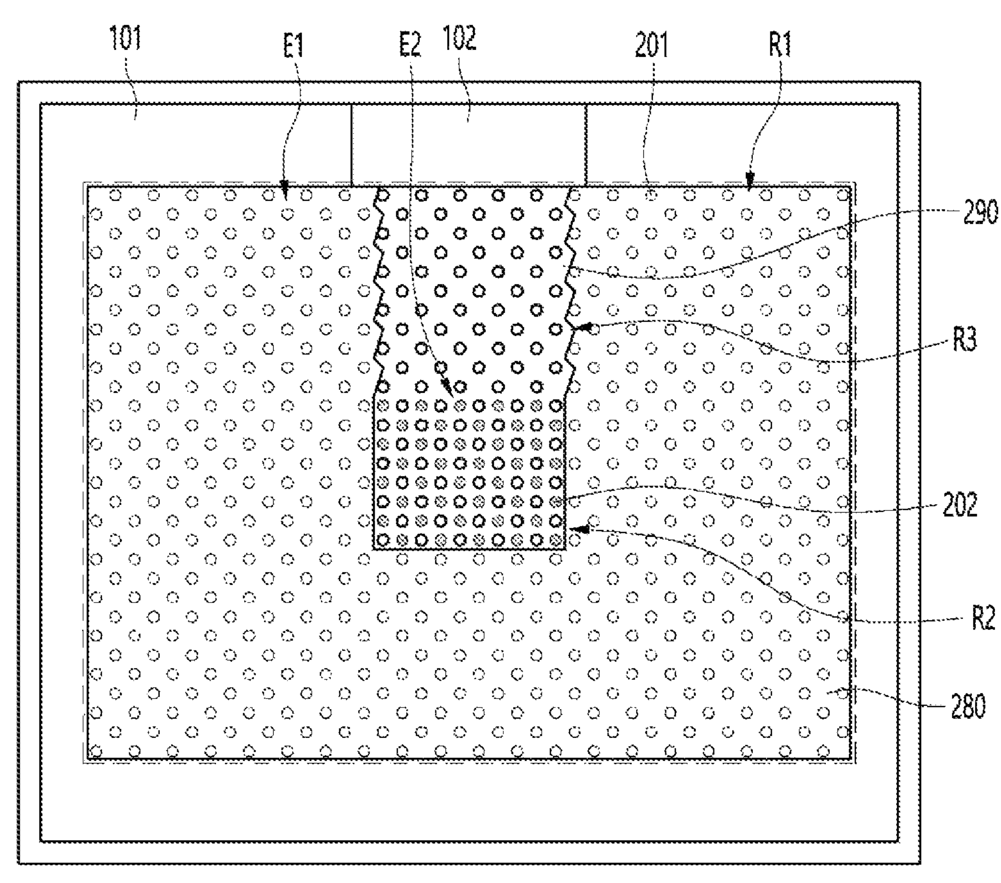
FIG. 3 is a view illustrating region of the first and second light emitting portions in the surface-emitting laser device of FIG. 2.
Figure 3:
Figure 4:
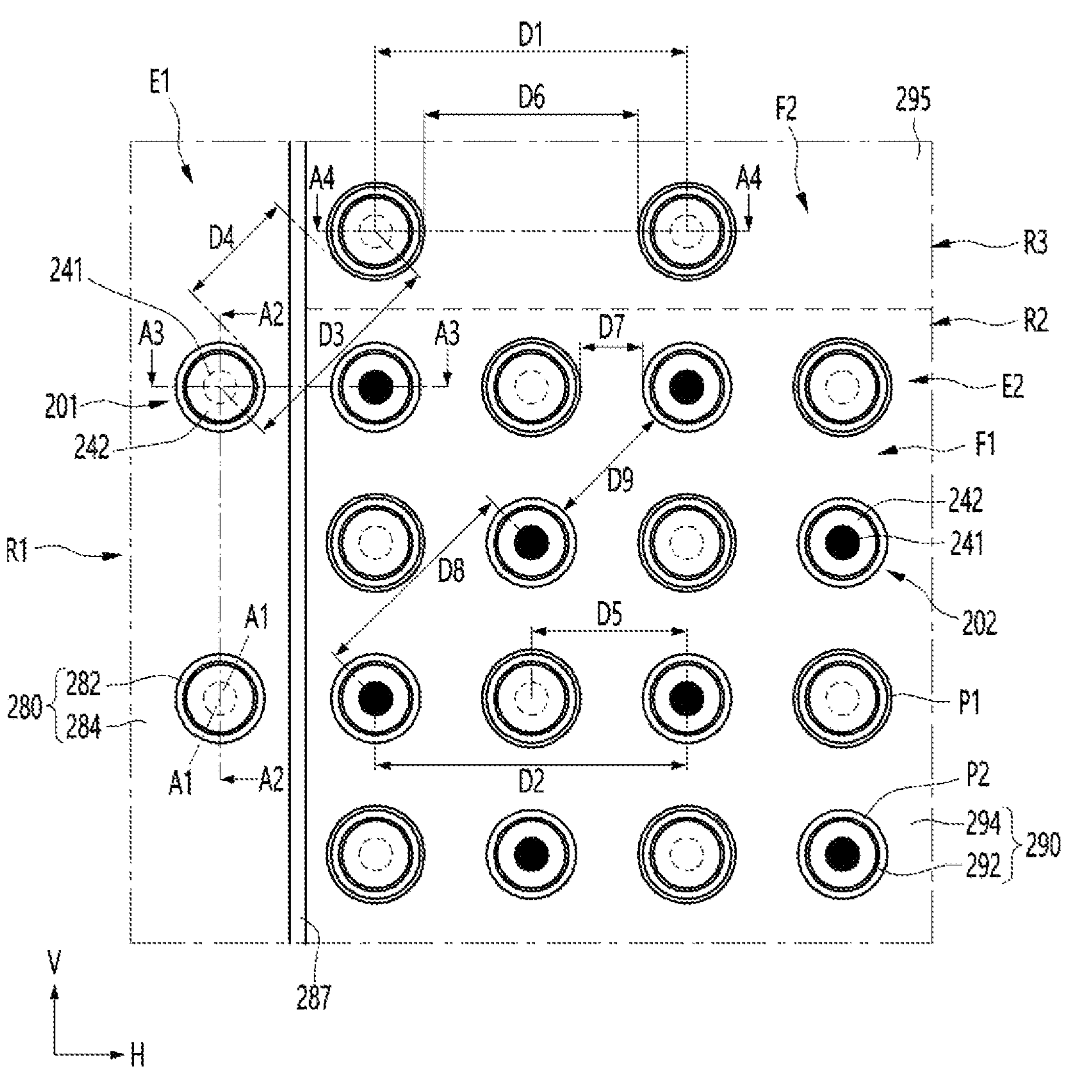
FIG. 4 is an enlarged view of the first light emitting portion and the second light emitting portion of FIG. 3.
Figure 5:
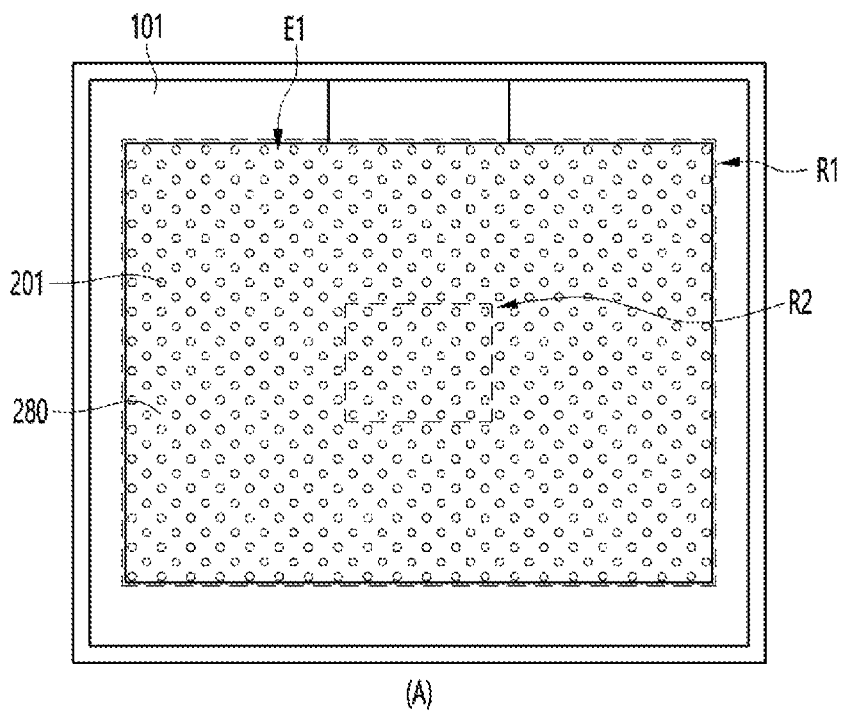
FIG. 5(A)(B) is diagrams for explaining the operation of the first light emitting portion and the second light emitting portion of FIG. 3.
Figure 5:
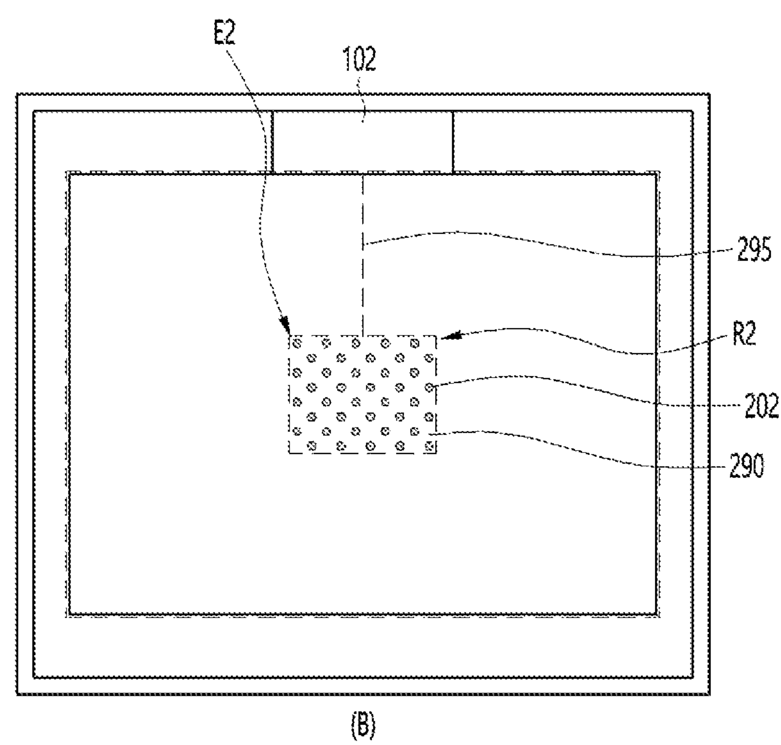
Figure 6:
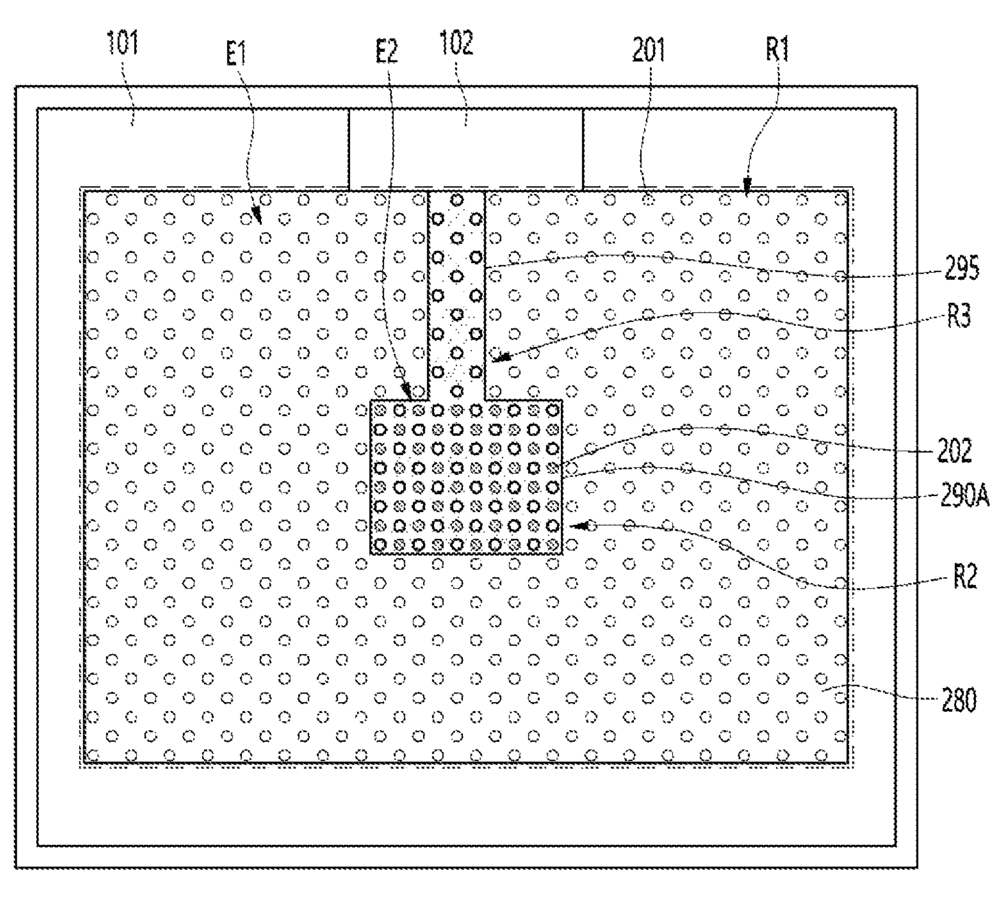
FIG. 6 is a modified example of a bridge electrode connected to a second light emitting portion in the surface-emitting laser device of FIG. 3.
Figure 7:
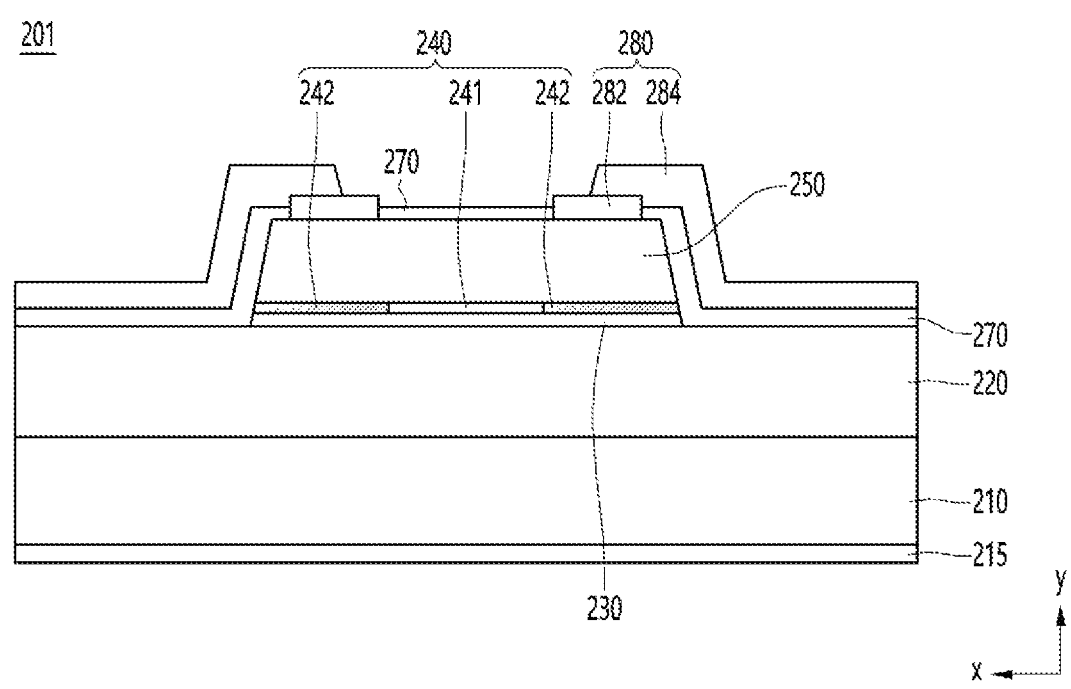
FIG. 7 is a side cross-sectional view taken along line A1-A1 of FIG. 4.
Figure 8:
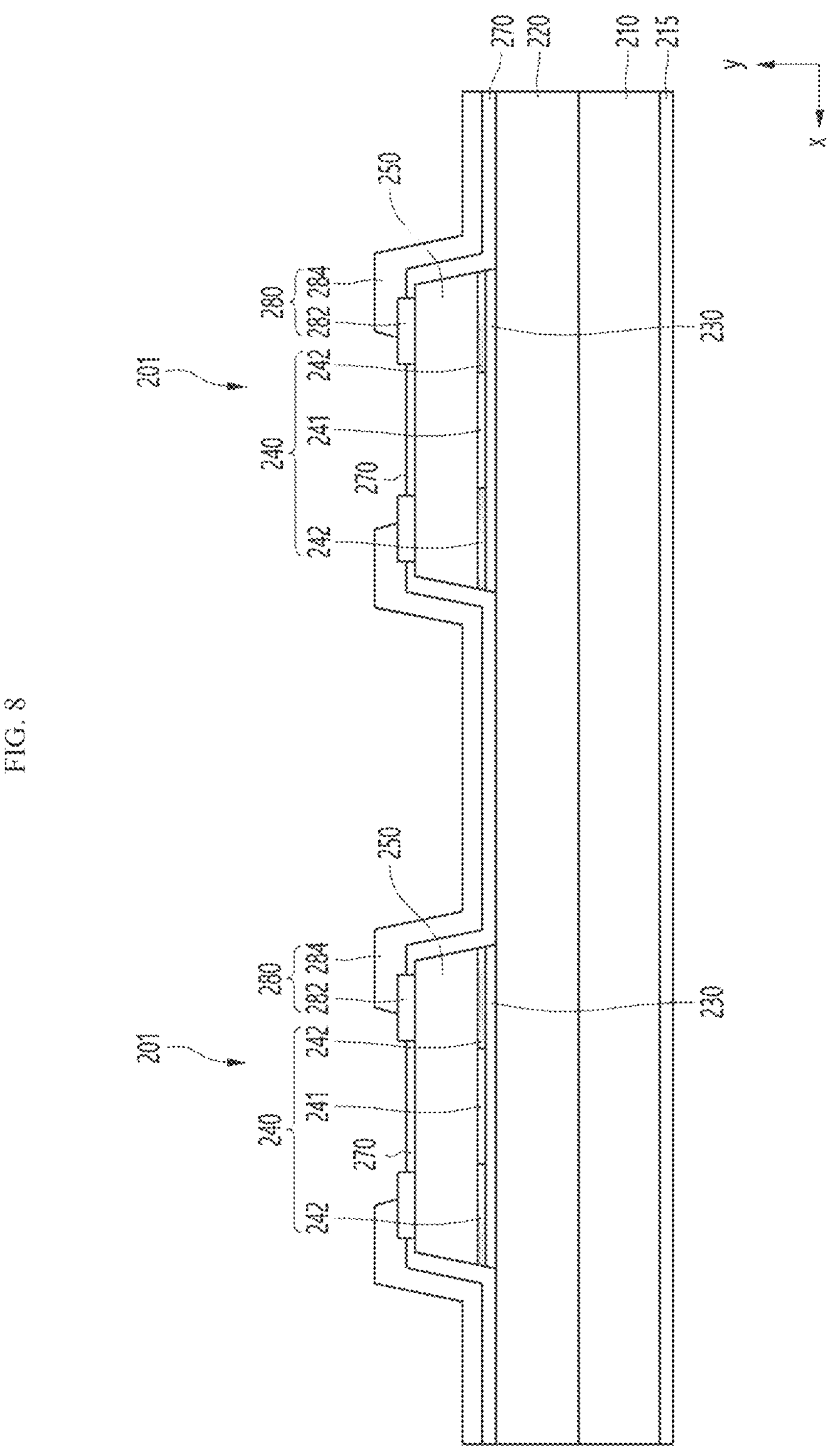
FIG. 8 is a side cross-sectional view taken along line A2-A2 of FIG. 4.
Figure 9:
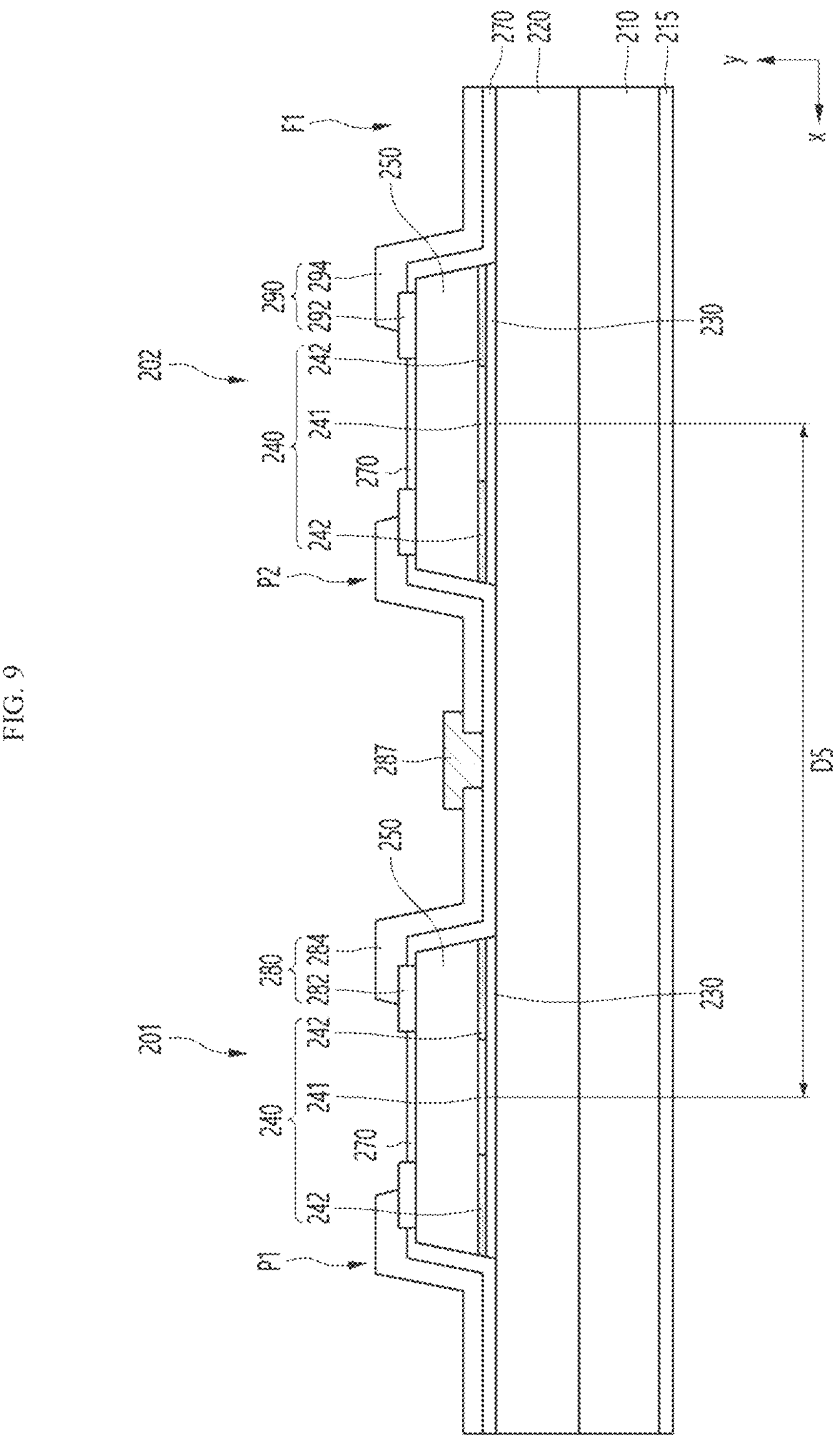
FIG. 9 is a side cross-sectional view taken along line A3-A3 of FIG. 4.
Figure 10:
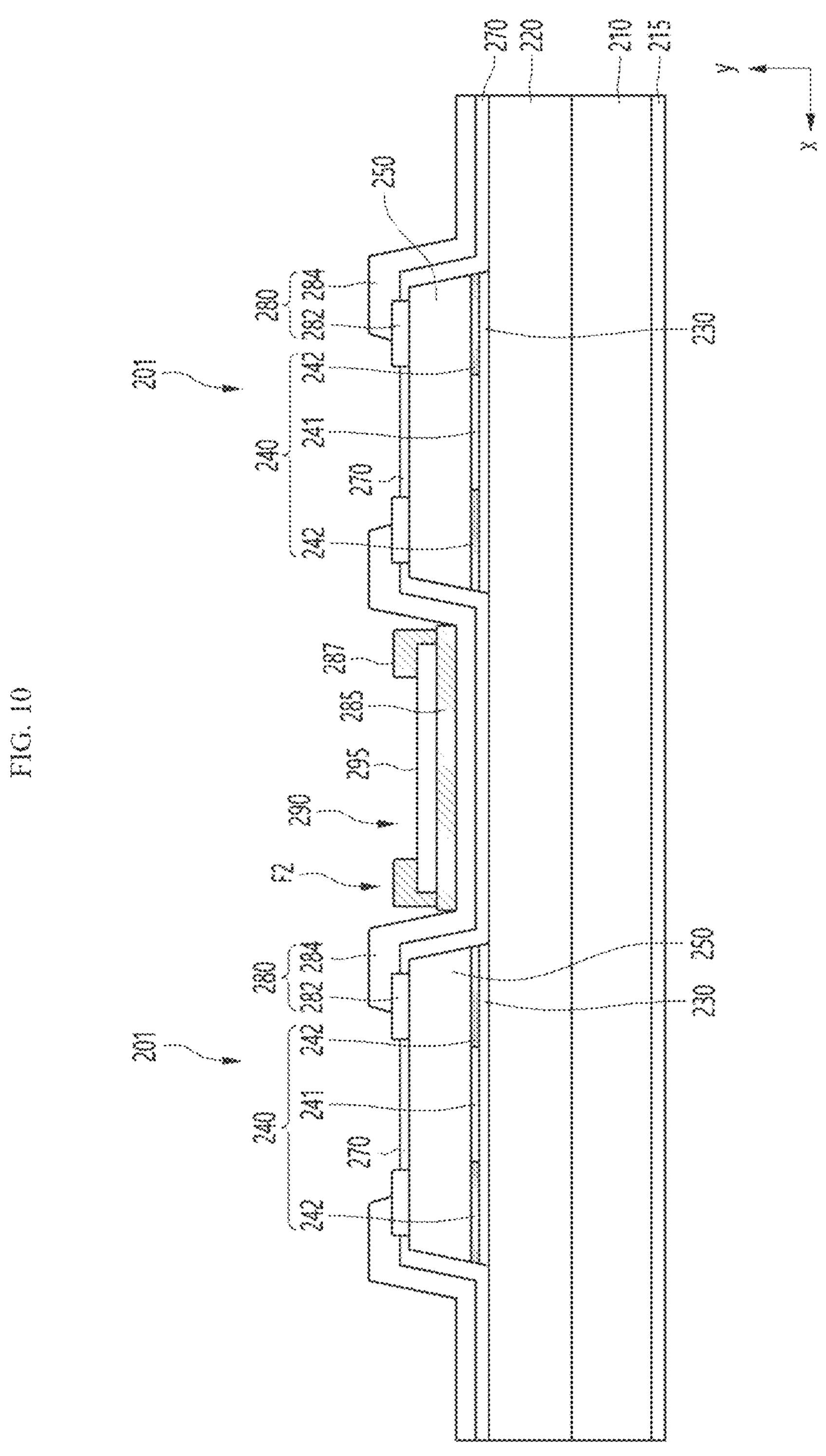
FIG. 10 is a side cross-sectional view taken along line A4-A4 of FIG. 4.

FIG. 1 is a conceptual diagram illustrating a distance measurement device according to an embodiment of the invention, FIG. 2 is a plan view of a surface-emitting laser device in a light source in the distance measurement device of FIG. 1, FIG. 3 is a view illustrating region of the first and second light emitting portions in the surface-emitting laser device of FIG. 2, FIG. 4 is an enlarged view of the first light emitting portion and the second light emitting portion of FIG. 3, FIG. 5(A)(B) is diagrams for explaining the operation of the first light emitting portion and the second light emitting portion of FIG. 3, FIG. 6 is a modified example of a bridge electrode connected to a second light emitting portion in the surface-emitting laser device of FIG. 3, FIG. 7 is a side cross-sectional view taken along line A1-A1 of FIG. 4, FIG. 8 is a side cross-sectional view taken along line A2-A2 of FIG. 4, FIG. 9 is a side cross-sectional view taken along line A3-A3 of FIG. 4, and FIG. 10 is a side cross-sectional view taken along line A4-A4 of FIG. 4.

Referring to FIG. 1, the distance measurement device 10 may be a sensor that irradiates light for detecting 3D information such as distance information on an object 1 located in front and obtains the irradiated light in real time. Here, the 3D information may include a 3D image or distance information. For example, the distance measurement device 10 may be applied to a portable terminal, an unmanned vehicle, an autonomous vehicle, a robot, a drone, a medical device, and the like. The distance measurement device 10 may include a light detection and ranging (LiDAR) device, a sensing device, or a camera module.

The distance measurement device 10 may include one or a plurality of light sources 30 and one or a plurality of light receiving portions 20. As for the light source 30, the output light 11 may be irradiated to the object 1, and the received light 12 reflected from the object 1 may be detected by the light receiving portion 20. The light source 30 may include an element irradiating light toward the object 1. The light source 30 may generate and irradiate a sine wave, a ramp wave, a square wave, a pulse wave, or continuous light. The light source 30 may generate and irradiate light of the same wavelength or light of a plurality of different wavelength bands. The light source 30 may output light by performing, for example, amplitude modulation or phase modulation. The light source 30 may emit light in the infrared region. When the light in the infrared region is used, mixing with natural light in the visible region including sunlight may be prevented. However, it is not necessarily limited to the infrared region and may emit light of various wavelength regions. In this case, correction may be required to remove the mixed natural light information. For example, the light source 30 may include a laser light source, but is not limited thereto. The light source 30 may include any one of an edge emitting laser, a vertical-cavity surface emitting laser (VCSEL), and a distributed feedback laser. For example, the light source 30 may include a laser diode. In addition, the light source 30 may be various types of lasers, such as a near-infrared semiconductor laser. According to the needs of the implementation, the light source 30 may be included in another device, and does not necessarily consist of hardware included in the distance measurement device 10.

The light receiving portion 20 may obtain, as the received light 12, intensity information of the light and distance information from the object 1. The light intensity information may include intensity values of lights reflected according to a region of the object 1, and the distance information may indicate a distance between the object 1 and the distance measurement device 10. The light receiving portion 20 may include a sensor (not shown) and a lens (not shown) therein, and light incident through the lens may be detected through the sensor.

The light source 30 is employed in a camera module, for example, a camera module for 3D image sensing. For example, the camera module for 3D image sensing may be a camera capable of capturing depth information of an object. Meanwhile, a separate sensor is mounted for depth sensing of the camera module, and it is divided into two types: a structured light (SL) method and a time of flight (ToF) method. The structured light (SL) method emits a laser of a specific pattern to the subject, and calculates the depth based on the degree of pattern deformation according to the shape of the subject's surface, and a shooting result of the three-dimensional image is obtained by synthesizing it with the image taken by the image sensor. In contrast, the ToF method measures the time it takes for the laser to reflect off the subject, calculates the depth, and combines it with the image taken by the image sensor to obtain a 3D shooting result. Accordingly, the SL method requires that the laser be positioned very accurately, but the ToF method has an advantage in mass production in that it relies on an improved image sensor, and either one of the SL and ToF methods, or both methods may be employed in one mobile phone.

The ToF has a direct/in-direct type, and the indirect type measures the distance using the phase difference between emitted light and received light, modulates the light source of the surface-emitting laser device (VCSEL) and may be driven so that turn on/off is repeated at a predetermined cycle. Here, the pixel of the sensor may include a pixel that is turned on and off in the same period as the light source and a pixel that is turned on/off with a phase difference of 180 degrees. In the in-direct type, in order to measure a distance by detecting a phase difference, a case of 0 and a case of 360 degrees may be recognized as the same distance. For example, the first case in which an object is located right in front of the light source and the second case in which the phase is changed by 360 degrees for the return time of the light because it is far from the light source and the period is the same may be processed and recognized as the same distance. In the first case, the light emitted from the light source may be directly detected by the sensor without a phase difference, and in the second case, the phase difference between the light source and the reflected light received by the sensor becomes 360 degrees, so that the phase difference disappears again. Accordingly, the blinking cycle of the light source and the sensor must be adjusted according to the target distance. In particular, as the distance between the object increases, the blinking cycle may be set longer (the modulation frequency is small).

As shown in FIGS. 1 and 2, the light source 30 may include a surface-emitting laser device 200 in which a plurality of emitters 201 and 202 are arranged. The surface-emitting laser device 200 may include a plurality of light emitting portions E1 and E2 that selectively emit light according to the regions R1 and R2. For example, the surface-emitting laser device 200 may include a first light emitting portion E1 that emits light in the entire region (e.g., R1) and a second light emitting portion E2 that emits light in a partial region (e.g., R2). The partial region is a region having a size smaller than the size of the entire region, and may be a center region within the entire region. The surface-emitting laser device 200 may include a first light emitting portion E1 and/or a second light emitting portion E2 having different field of view (FOV) and irradiating light. The surface-emitting laser device 200 may include the first light emitting portion E1 and/or the second light emitting portion E2 for irradiating light for different zoom functions.

Referring to FIGS. 2 and 3, the surface-emitting laser device 200 includes a first light emitting portion E1 and a first pad 101 connected to the first emitters 201 of the first light emitting portion E1, a second light emitting portion E2, and a second pad 102 connected to the second emitters 202 of the second light emitting portion E2. The first light emitting portion E1 may include the array of the first emitters 201, and the array of the first emitters 201 may be arranged in a matrix in the first region R1. The first region R1 is the entire region of the surface-emitting laser device 200, and may have a horizontal length H1 in the first direction H greater than a vertical length V1 in the second direction V. Here, the first direction H may be a horizontal direction, a row direction, or a first horizontal direction. The second direction V may be a direction orthogonal to the first direction, and may be a column direction or a second horizontal direction orthogonal to the first horizontal direction. The third direction may be a diagonal direction between the first direction H and the second direction V. The horizontal length H1 and the vertical length V1 of the first region R1 may be provided as a light emitting area for a zoom region of 1× based on a predetermined angle of view FOV. The angle of view due to the light irradiated by the first light emitting portion E1 or the reference angle of view may be, for example, 70 degrees or more, for example, 80 degrees to 90 degrees. The horizontal length H1 may be in the range of 1 mm or more, for example, 1.2 mm to 1.5 mm. The vertical length V1 may be in the range of 0.7 mm or more, for example, 0.7 mm to 1.2 mm. When the ratio of the horizontal length H1 to the vertical length V1 is 4:3 or the ratio H1:V1 is a ratio of a:b, a>b has a relationship, wherein a may be greater than one times than the b.

The second light emitting portion E2 includes an array of the second emitters 202, and the array of the second emitters 202 may be disposed in an area of the second region R2 smaller than an area of the first region R1. The first region R1 may be a region in which the first emitters 201 are disposed in the entire region. The second region R2 is a region in which the first emitters 201 and the second emitters 202 are alternately arranged in the center region of the first region R1, or the second emitter 202 may be arranged. In the second region R2, first emitters 201 and second emitters 202 may be alternately arranged, and each of the second emitters 202 may be disposed between the first emitters 201. As another example, the second region R2 may be surrounded by a region in which the second emitter 202 is not disposed among the first region R1. Accordingly, the second emitters 202 in the second region R2 may be arranged in the form of an open looped and/or closed loop by the first region R1 or the first emitters 201. Alternatively, the first emitters 201 in the second region R2 may be disposed in an open loop or/and a closed loop form by the second emitters 201.

Referring to FIGS. 4 and 3, the first region R1 may include a third region R3, and the third region R3 may disposed between the second region R2 and the second pad 102. In the second region R2, first and second emitters 201 and 202 may be alternately disposed in the first and second directions H and V. In the first region R1 and/or the third region R3, the first emitters 201 may be arranged at the same pitch D1 in the first direction H or/and the second direction V. In the first region R1 and/or the third region R3, the separation distance D6 of the first emitters 201 in the first direction H and/or the second direction V may be greater than the separation distance D4 in the diagonal direction. The pitch D1 between the first emitters 201 in the first and second directions H and V may be greater than the pitch D3 of the first emitters 201 in the oblique direction (i.e., the third direction). The pitch D1 between the first emitters 201 adjacent in the first region R1 in the first and second directions H and V may be equal to the pitch D2 between the second emitter 202 adjacent in the second region R2. And, the pitch D5 between the first and second emitters 201 and 202 adjacent in the second region R2 in the first direction H or/and the second direction V may be ½ of the pitch D2 of the second emitter 202. The pitch D5 between the first and second emitters 201 and 202 adjacent in the second region R2 in the first and second directions H and V may be 1.2 of the pitch D1 of the first emitters 201 adjacent to each other in the first region R1. The second emitters 202 may be disposed at a uniform pitch D2 in each region between the first emitters 201 having a uniform pitch D1 in the second region R2. A pitch D3 between the first and second emitters 201 and 202 in a third direction (i.e., an oblique direction) in the second region R2 may be the same as the pitch D8 the adjacent first emitters 201 in the first region R1. A pitch between the first emitters 201 and a pitch D8 between the second emitters 202 in the third direction in the second region R2 may be the same. The pitch D5, which is an interval between the first and second emitters 201 and 202, may be, for example, 40 μm or more or a range of 40 to 60 μm in consideration of the light emitting layer.

The separation distance D7 between the emitters 201 and 202 adjacent in the first and second directions within the second region R2, that is, the minimum distance may be the same from each other. The distance D7 between the emitters 201 and 202 adjacent in the first and second directions H and V in the second region R2 may be smaller than the distance between the first emitters 201 in the third direction (that is, D4) or the separation distance D9 between the second emitters 202 D9. The separation distance D7 may be ½ of the separation distance D6.

The area of the second region R2 may be 30% or less, for example, 4% to 25% within the area of the first region R1. Here, the second region R2 may have the same length in the first direction from the center position of the first and second regions R1 and R2 and may have the same length in the second direction. The second region R2 may be disposed in a circular or polygonal shape at the center of the first region R1.

As a first example, when the second region R2 has an area of 25%±2% of the total area, the angle of view by the light irradiated by the second light emitting portion E2 may be provided in the range of 40 degrees to 50 degrees. As a second example, when the second region R2 has an area of 11%±1.5% of the total area, the angle of view by the light irradiated by the second light emitting portion E2 may be provided in the range of 25 degrees to 35 degrees. As a third example, when the second region R2 has an area of 6%±1% of the total area, the angle of view by the light irradiated by the second light emitting portion E2 may be provided in the range of 20 degrees to 25 degrees. As a fourth example, when the second region R2 has an area of 4%±1% of the total area, the angle of view by the light irradiated by the second light emitting portion E2 may be provided in the range of 15 degrees to 23 degrees. Here, the total area may be the area of the first region R1.

Here, in the first example, the total number of the second emitters 202 of the second light emitting portion E2 may be 25% or less of the total number of the first emitters 201, for example, in the range of 20% to 25%. In the second example, the total number of the second emitters 202 of the second light emitting portion E2 may be 15% or less of the total number of the first emitters 201, for example, in the range of 9% to 15%. In the third example, the total number of the second emitters 202 of the second light emitting portion E2 may be 8% or less, for example, in the range of 4% to 8% of the total number of the first emitters 201. In the fourth example, the total number of the second emitters 202 of the second light emitting portion E2 may be 6% or less, for example, in the range of 2% to 6% of the total number of the first emitters 201. Here, the total number of the first emitters 201 may be 450 or more, for example, in the range of 450 to 1000, and the number of the second emitters 202 may be at least 20 or more. According to the first to fourth examples, the number of second emitters 202 may be calculated and disposed. Here, the total number of first emitters 201 is the number of first emitters 201 disposed in the first region R1.

The second region R2 may be provided according to a zoom magnification and an angle of view according to any one of the first to fourth examples. According to the first example, the light from the second light emitting portion E2 may be provided in a zoom mode of 2 times compared to the reference multiple 1×, and according to the second example, the light from the second light emitting portion E2 may be provided in a zoom mode of 3 times the compared to the reference multiple, and according to the third example, the light of the second light emitting portion E2 may be provided in a zoom mode of 4 times the reference multiple, or according to the fourth example, the light from the second light emitting portion E2 may be provided in a zoom mode of 5 times compared to the reference multiple. Here, when only the second light emitting portion E2 is driven according to the first example, power consumption of 5.8%±1.2% may be saved compared to the power consumption of the first light emitting portion E1. When only the second light emitting portion E2 is driven according to the second example, power consumption of 2.9%±0.5% may be saved compared to the power consumption of the first light emitting portion E1. When only the second light emitting portion E2 is driven according to the third example, power consumption of 1.7%±0.3% may be saved compared to the power consumption of the first light emitting portion E1. Alternatively, when only the second light emitting portion E1 is driven according to the first example, power consumption of 1%±0.2% may be saved compared to the power consumption of the first light emitting portion E1.

By selectively driving the first and second light emitting portions E1 and E2 to the first region R1 and/or the second region R2, it is possible to provide light according to different angles of view and different zoom magnifications. In addition, power consumption may be reduced by up to 6% compared to the case in which the second region R2 is not provided. As another example, a sub-region (not shown) having a third emitter (not shown) may be disposed in the second region R2, and sub-region (not shown) having a fourth emitter (not shown) may be disposed in the third region, for example, an n+1 region having n+1 emitters disposed within an n (n is 3 or more) region having n emitters may be disposed.

The first and second emitters 201 and 202 may include, for example, a vertical-cavity surface-emitting laser (VCSEL). Each of the first and second emitters 201 and 202 may be defined as an emitter having an opening. The first and second emitters 201 and 202 may emit light in a range of 750 nm or more, for example, in a range of 750 nm to 1100 nm or in a range of 750 nm to 950 nm. The first and second emitters 201 and 202 may emit the same peak wavelength.

As shown in FIG. 5(A), the first emitters 201 may emit light when power is supplied to the first pad 101. The first pad 101 may be electrically connected to the first electrode 280 extending through the upper portion of the first light emitting portion E1. As shown in FIG. 5(B), the second emitters 202 may emit light when power is supplied to the second pad 102. The second emitters 202 may be electrically connected to a second electrode 290 extending through upper portions of the first light emitting portion E1 and the second light emitting portion E2. The first pad 101 may be a region to which an external power terminal, for example, a wire or a bonding member, is connected among the external regions of the first electrode 280. The second pad 102 may be a region to which an external power terminal, for example, a wire or a bonding member, is connected among the external regions of the second electrode 290. The second pad 102 may be disposed in a region closest to the second region R2 among areas in which the first pad 101 is disposed, and may be disposed between regions of the first pad 101. The second pad 102 may be disposed on an outer portion of the first region R1 with an area smaller than that of the first pad 101.

As shown in FIGS. 4 and 6, the second electrode 290 of the second pad 102 and the second emitter 202 may be connected to a bridge electrode 295. One or a plurality of bridge electrodes 295 may be disposed. The bridge electrode 295 may be disposed along a third region R3 between the second pad 102 and the second region R2, and may extend along the outer upper portions of the first emitters 201. The width of the bridge electrode 295 may be equal to or smaller than the width of the second pad 102. The width of the bridge electrode 295 may be equal to or smaller than the width of the second light emitting portion E2.

Here, when the bridge electrode 295 extends on the third region R3 and is formed without the first emitter 201, a loss in luminous intensity may occur due to a decrease in the number of the first emitters 201 due to the area covered by the bridge electrode 295, and a desired field of illumination (FOI) may not be obtained. In addition, when extending through the first connection portion 284 of the first electrode 280 between the first emitters 201, the width of the bridge electrode 295 of the second electrode 280 may be narrow, and accordingly, the resistance of the bridge electrode 295 may increase and the operating voltage increase. According to an embodiment of the invention, the light loss may be reduced by arranging the bridge electrode 295 of the second electrode 290 to overlap the first connection portion 284 of the first electrode 280 in the vertical direction Y. In addition, the region in which the second pad 102 is formed is formed separately from the first pad 101, so that it may be formed as a single layer. Accordingly, by partially stacking the first and second electrodes 280 and 290 in multi-layers in the second region R2 and the third region R3, a metal (e.g., Au) material may be saved, and since the width of the bridge electrode of the second electrode 290 is formed as wide as possible, the operating voltage may be reduced and current diffusion may be improved.

The second region R2 may be an area of the first region R1, that is, an area of 30% or less of the total area, for example, in a range of 4% to 30% or in a range of 4% to 25%. This second region R2 includes the second emitter 202 within the above range and selectively drives the second emitter 202, thereby reducing the power consumption of the surface-emitting laser device 200. In addition, power consumption by the second region R2 having second emitters 202 for a zoom function higher than that of the first emitter 201 or the angle of view smaller than the reference angle of view (FOV) may be reduced by up to 6%. That is, when the zoom function of more than 1× is used, power consumption may be reduced by driving only the second emitter 202 of the second region R2 and turning off the first emitter 201. Also, in the case of the reference angle of view or the 1× zoom mode, the first emitter 201 may be turned on and the second emitter 202 may be turned off.

In addition, when driving the second region R2 other than the entire region in the surface-emitting laser device, since the first emitter 201 and the second emitter 202 are used to independently drive, while the difference in current applied to each second emitter 202 to obtain the same current density is removed, the current supplied to the second region R2 may be reduced, and total power consumption may also be reduced. Here, since the stacked structure of the first and second emitters 201 and 202 is provided in the same structure, the first emitter 201 will be mainly described, and for the second emitter 202, the first emitter 201 will be referred to. In addition, a configuration different from the first emitter 201 and an additional configuration in the stacked structure of the second emitter 202 will be described later.

Referring to FIGS. 4, 7 and 8, the first emitter 201 may include a lower electrode 215, a substrate 210, a first reflective layer 220, a light emitting layer 230, an oxide layer 240, a second reflective layer 250, a passivation layer 270, and a first electrode 280. The first electrode 280 may include a first contact portion 282 and a first connection portion 284. The second electrode 290 may include a second contact portion 292 and a second connection portion 294, and the description of the first electrode 280 will be referred to.

The first emitter 201 may include a substrate 210. The substrate 210 is disposed between the first reflective layer 220 and the lower electrode 215 and may be a conductive substrate or a non-conductive substrate. As the conductive substrate, a metal having excellent electrical conductivity may be used. Since the substrate 210 must be able to sufficiently dissipate heat generated during the operation of the first emitter 201, a GaAs substrate or a metal substrate having high thermal conductivity may be used, or a silicon (Si) substrate may be used. As the non-conductive substrate, an AlN substrate, a sapphire ($Al_2O_3$) substrate, or a ceramic-based substrate may be used.

The lower electrode 215 may be disposed under the substrate 210. The lower electrode 215 may be formed of a conductive material in a single layer or in multiple layers. For example, the lower electrode 215 may be a metal, and has a single-layer or multi-layer structure including at least one of aluminum (Al), titanium (Ti), chromium (Cr), nickel (Ni), copper (Cu), and gold (Au) and may increase the light output by improving the electrical characteristics. The lower electrode 215 may be a common electrode or a cathode terminal commonly connected to the first emitter 201 and the second emitter 202.

The first reflective layer 220 may be disposed on the substrate 210. When the substrate 210 is omitted to reduce the thickness, the lower surface of the first reflective layer 220 may be in contact with the upper surface of the lower electrode 215. The first reflective layer 220 may be doped with a first conductivity-type dopant. For example, the first conductivity-type dopant may include an n-type dopant such as Si, Ge, Sn, Se, Te, or the like. The first reflective layer 220 may include a gallium-based compound, for example, AlGaAs, but is not limited thereto. The first reflective layer 220 may be a distributed Bragg reflector (DBR). For example, the first reflective layer 220 may have a structure in which first and second layers including materials having different refractive indices are alternately stacked at least once or more. The thickness of the layer in the first reflective layer 220 may be determined according to each refractive index and the wavelength of light emitted from the light emitting layer 230.

The light emitting layer 230 may be disposed on the first reflective layer 220. Specifically, the light emitting layer 230 may be disposed between the first reflective layer 220 and the second reflective layer 250. The light emitting layer 230 may be disposed between a partial region of the first reflective layer 220 and the second reflective layer 250. The light emitting layer 230 may include an active layer and at least one cavity therein, and the active layer may include any one of a single well structure, a multi well structure, a single quantum well structure, a multi quantum well (MQW) structure, a quantum dot structure, and a quantum wire structure. The active layer may have a pair of InGaAs/AlxGaAs, AlGaInP/GaInP, AlGaAs/AlGaAs, AlGaAs/GaAs, GaAs/InGaAs, etc. using a Group III-V or a Group II-VI compound semiconductor material and be formed in a 1 to 3 pair structure, but is not limited thereto. The cavity may be formed of an $Al_yGa_{(1-y)}As_{(0<y<1)}$ material, and may include a plurality of layers of $Al_yGa_{(1-y)}As$, but is not limited thereto.

The oxide layer 240 may include an insulating region 242 and an opening 241. The insulating region 242 may surround the opening 241. For example, the opening 241 may be disposed on a light emitting region (center region) of the light emitting layer 230, and the insulating region 242 may be disposed on a non-emitting region (edge region) of the light emitting layer 230. The non-emitting region may surround the light-emitting region. The opening 241 may be a passage region through which current flows. The insulating region 242 may be a blocking region that blocks the flow of current. The insulating region 242 may be referred to as an oxide layer or an oxide layer. The oxide layer 240 restricts the flow or density of current so that a more concentrated laser beam is emitted, and thus may be referred to as a current confinement layer.

The amount of current supplied from the first electrode 280 to the light emitting layer 230, i.e., a current density, may be determined by the size of the opening 241. The size of the opening 241 may be determined by the insulating region 242. As the size of the insulating region 242 increases, the size of the opening 241 decreases, and when the size of the opening 241 decreases, the current density supplied to the light emitting layer 230 may increase. In addition, the opening 241 may be a passage through which the beam generated by the light emitting layer 230 travels in the upper direction, that is, in the direction of the second reflective layer 250. That is, the divergence angle of the beam of the light emitting layer 230 may vary according to the size of the opening 241.

The insulating region 242 may be formed of an insulating layer, for example, aluminum oxide ($Al_2O_3$). For example, when the oxide layer 240 includes aluminum gallium arsenide (AlGaAs), in the AlGaAs of the oxide layer 240, the edge region that reacts with $H_2O$ is changed to aluminum oxide ($Al_2O_3$) to form an insulating region 242, and the central region that does not react with $H_2O$ becomes an opening 241 containing AlGaAs.

Light emitted from the light emitting layer 230 through the opening 241 may be emitted to the upper region, and the light transmittance of the opening 241 may be higher than that of the insulating region 242. The insulating region 242 may include a plurality of layers, for example, at least one layer may include a Group III-V or a Group II-VI compound semiconductor material. The second reflective layer 250 may be disposed on the oxide layer 240. The second reflective layer 250 may include a gallium-based compound, for example, AlGaAs. The second reflective layer 250 may be doped with a second conductivity-type dopant. The second conductivity-type dopant may be a p-type dopant such as Mg, Zn, Ca, Sr, or Ba. As another example, the first reflective layer 220 may be doped with a p-type dopant, and the second reflective layer 250 may be doped with an n-type dopant. The second reflective layer 250 may be a distributed Bragg reflector (DBR). For example, the second reflective layer 250 may have a structure in which a plurality of layers including materials having different refractive indices are alternately stacked at least once or more. Each layer of the second reflective layer 250 may include AlGaAs, and specifically, may be made of a semiconductor material having a composition formula of $Al_xGa_{(1-x)}As_{(0<x<1)}$ having a different composition of x. have. Here, when Al increases, the refractive index of each layer may decrease, and when Ga increases, the refractive index of each layer may increase. The thickness of each layer of the second reflective layer 250 may be λ/4n, λ may be the wavelength of light emitted from the active layer, and n may be the refractive index of each layer at the wavelength of light. The second reflective layer 250 may be formed by alternately stacking layers, and the number of pairs of layers in the first reflective layer 220 may be greater than the number of pairs of layers in the second reflective layer 250. Here, the reflectance of the first reflective layer 220 may be greater than that of the second reflective layer 250. Here, the layers from the first reflective layer 220 to the second reflective layer 250 may be defined as light emitting structures. The upper portion of the light emitting structure may be provided as an inclined side surface. An upper portion of the light emitting structure may be exposed to an inclined side surface by a mesa etching process.

The passivation layer 270 may be disposed around the upper portion of the light emitting structure. The upper portion of the light emitting structure may include, for example, a light emitting layer 230, an oxide layer 240, and a second reflective layer 250. The passivation layer 270 may be disposed on the upper surface of the first reflective layer 220. The passivation layer 270 may be disposed on an edge region of the second reflective layer 250. When the light emitting structure is partially etched, a portion of the upper surface of the first reflective layer 220 may be exposed, and a portion of the light emitting structure may be disposed in a protruding form. The passivation layer 270 may be disposed on the periphery of a partial region of the light emitting structure and on the exposed upper surface of the first reflective layer 220.

The passivation layer 270 may protect the light emitting structure from the outside and may block an electrical short between the first reflective layer 220 and the second reflective layer 250. The passivation layer 270 may be formed of an insulating material or a dielectric material, for example, may be formed of an inorganic material such as $SiO_2$, but is not limited thereto.

The first electrode 280 may include a first contact portion 282 and a first connection portion 284 connected to the first contact portion 282. The first contact portion 282 may be in contact with a portion of the upper surface of the second reflective layer 250. The first contact portion 282 may be in ohmic contact with the second reflective layer 250. The first connection portion 284 may connect the first contact portion 282 and the first pad (see 101 of FIG. 4), and may connect the adjacent first emitters 201. The first contact portion 282 and the first connection portion 284 may be formed of a conductive material. For example, the first contact portion 282 and the first connection portion 284 may be formed in a single-layer or multi-layer structure including at least one aluminum (Al), titanium (Ti), chromium (Cr), nickel (Ni), copper (Cu), or gold (Au). The first contact portion 282 and the first connection portion 284 may be formed of the same metal or non-metal material, or may be formed of different materials. The second contact portion 292 and the second connection portion 294 may be selected from materials of the first contact portion 282 and the first connection portion 284. The first contact portion 282 may be in contact with the second reflective layer 250 on the outer periphery of the passivation layer 270 overlapping the opening 241 in the vertical direction Y. The first contact portion 282 may be in contact with the second reflective layer 250 through the passivation layer 270, and may be disposed around the upper periphery of the second reflective layer 250 in a loop shape or a closed loop shape.

As shown in FIG. 4, in each of the first and second emitters 201 and 202, when viewed from a top view, the opening 241 is disposed at the center, and the insulating region 242 and the first and second contact portions 282 and 292 may be disposed around the insulating region 242.

As shown in FIG. 10, the first insulating layer 285 may be disposed on the third region R3 between the second region R2 and the second pad 102. The first insulating layer 285 may be disposed between the first electrode 280 of the first light emitting portion E1 and the bridge electrode 295 of the second electrode 290 of the second light emitting portion E2. The first insulating layer 285 may be disposed on an upper portion of the first electrode 280 of the first emitter 201 and a lower portion of the bridge electrode 295 of the second electrode 290 of the second emitter 202, and may electrically and physically separate the first connection portion 284 of the first electrode 280 from the bridge electrode 295. Accordingly, the bridge electrode 295 of the second electrode 290 on the third region R3 may be electrically insulated from the first electrode 280 by the first insulating layer 285. The second insulating layer 287 may extend on an outer upper portion of the bridge electrode 295. The first insulating layer 285 is disposed between the second connection portion 294 of the second electrode 290 and the first connection portion 284 of the first electrode 280 in the second region R2, and may insulate between the first and second connection portions 284 and 294. The first connection portion 284, the first insulating layer 285, and the second connection portion 294 may be disposed to overlap in the vertical direction Y in a portion of the second region R2. That is, after the first contact portion 292 of the first electrode 280 and the second electrode 290 is formed, the passivation layer may be formed or may be formed by a reverse process, after which the first insulating layer 285 is formed, thereafter, the process of forming the second connection portion 294 of the second electrode 290 may be performed. Accordingly, the first insulating layer 285 may separate the first electrode 280 and the second electrode 290 on the first connection portion 284 of the first electrode 280. The vertical direction Y is a direction orthogonal to the first and second directions H and V of FIG. 4, and the direction X orthogonal to the vertical direction Y is the first direction H or the second direction V of FIG. 4, or may be in a diagonal direction. Here, as shown in FIGS. 4 and 10, the second connection portion 294 of the second electrode 290 the bridge electrode 295 connected to the second connection portion 294 may extend on the flat portions F1 and F2 outside the light emitting structure. The flat portions F1 and F2 are flat portions of upper portions of the first and second emitters 201 and 202, and may be mesa-etched regions around the protruding portions P1 and P2 of the light emitting structure. With respect to the adjacent protruding portions P1 and P2, the minimum width of the first flat portion F1 of the second region R2 may be a separation distance D7 between the adjacent protruding portions P1 and P2 of the first and second emitters 201 and 202. In the region between the adjacent protruding portions P1 and P2, the maximum width of the first flat portion F1 of the second region R2 may be the distance between the first protruding portions P1 of the first emitter 201 or may be the separation distance D9 between the second protruding portions P2 of the second emitter 202. Here, the separation distance D7, which is the minimum width, may be formed in a range of at least 7 μm or more, for example, in the range of 7 μm to 12 μm, and the separation distance D9, which is the maximum width, may be formed of in 10 μm or more, for example, in the range of 10 μm to 20 μm. Accordingly, the second connection portion 294 of the second electrode 290 may have the above-described separation distances D7 and D9 depending on the region, and may connect the adjacent second emitters 202 to each other, and may give a current spreading effect without increasing the connection resistance. Also, the bridge electrode 295 of the second electrode 290 has a minimum width (i.e., D7) along the region between the first protruding portions P1 of the first emitter 202, and may extended to both sides of each of the first protruding portion P1. Accordingly, the connection resistance by the bridge electrode 295 is not increased, the current is spread, and the operating voltage may be decreased.

As shown in FIGS. 4 and 9, the second insulating layer 287 may be further disposed in a boundary region between the first light emitting portion E1 and the second light emitting portion E2. The second insulating layer 287 may insulate between the first connection portion 284 of the first electrode 280 of the first light emitting portion E1 and the second connection portions 294 of the second electrode 290 of the second light emitting portion E2. Accordingly, the second insulating layer 287 may electrically and physically separate the second connection portion 294 of the second electrode 290 of the second light emitting portion E2 from the first electrode 280 of the first light emitting portion E1 to on the outside of the second region R2. The second insulating layer 287 may extend in a straight line in one direction along the boundary region or in a zigzag shape. That is, the second insulating layer 287 is disposed in a region that does not spatially affect the adjacent emitters 201 and 202 or may extend between the first connection portion 284 of the first electrode 280 and the second connection portion 294 of the second electrode 290 or the bridge electrode 295 so that the opening 241 is not affected. The first insulating layer 285 and the second insulating layer 287 may be made of an insulating material, for example, may include at least one of nitride or oxide, for example, polyimide, silica ($SiO_2$), or silicon nitride ($Si_3N_4$).

Figure 11:
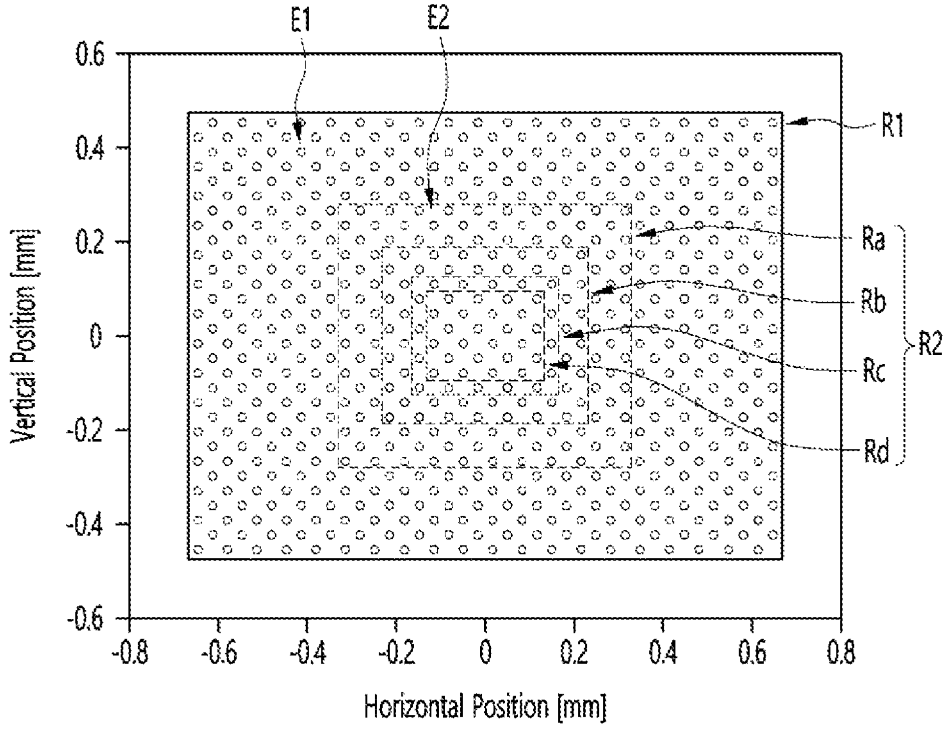
FIG. 11 is a view for explaining another example of the second light emitting portion in the surface-emitting laser device according to an embodiment of the invention.
Figure 12:
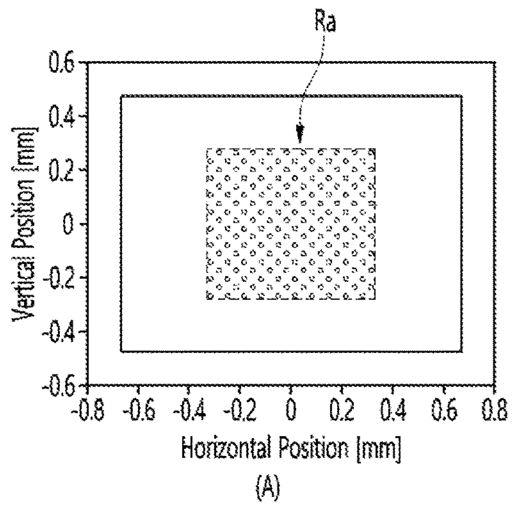
FIG. 12(A)-(D) are views for explaining a region according to driving of the second light emitting portion of FIG. 11.
Figure 12:
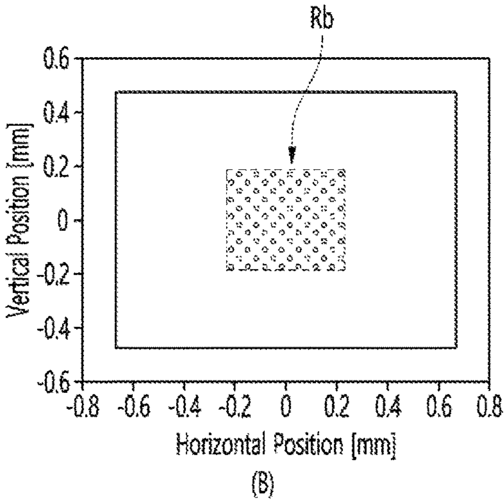
Figure 12:
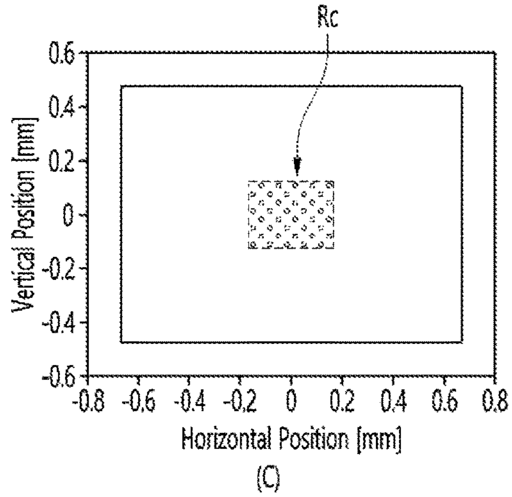
Figure 12:
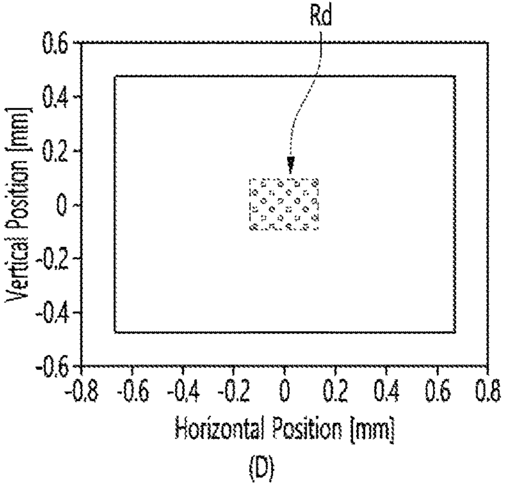
Figure 13:
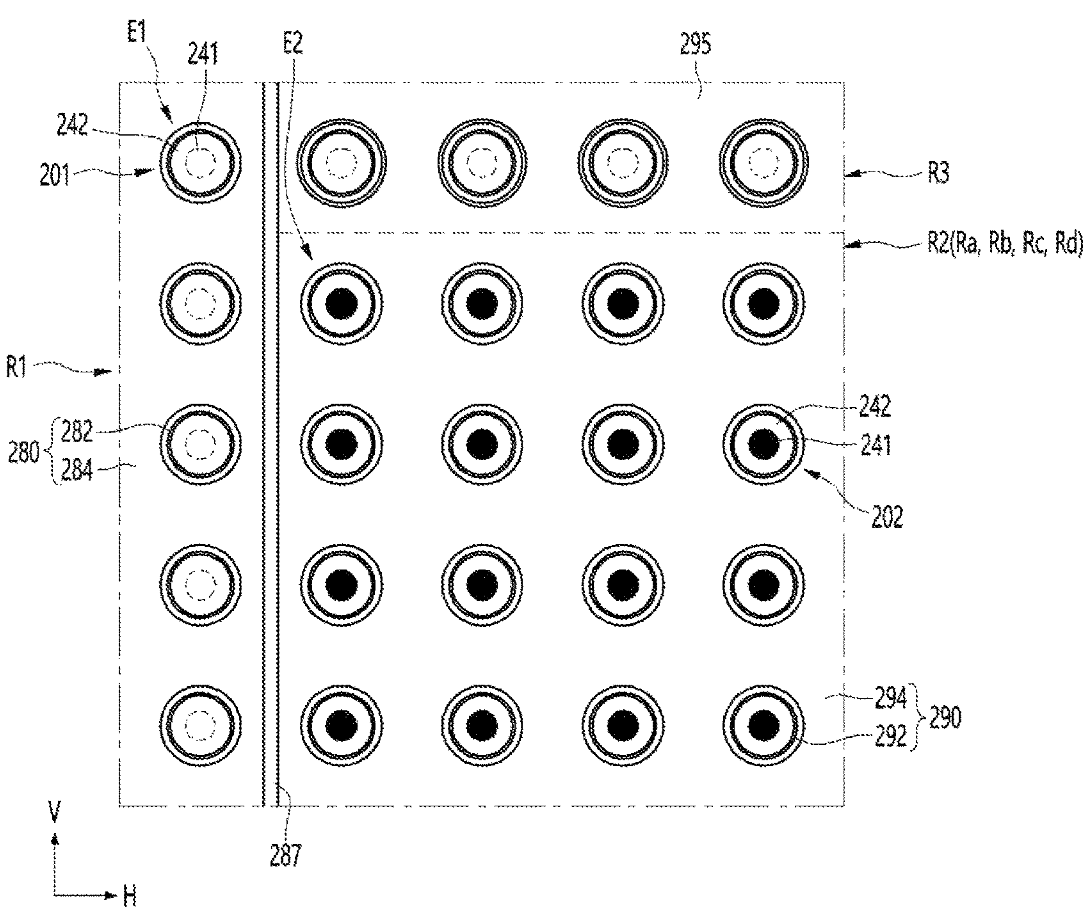
FIG. 13 is a view illustrating a first light emitting portion and a second light emitting portion of the surface-emitting laser device of FIGS. 11 and 12.

Referring to FIGS. 11 to 13, in the surface-emitting laser device, the first region R1 may include the third region R3 and may be a region excluding the second region R2. In the full driving mode or the reference angle of view, all of the light emitting portions E1 and E2 of the first region R1 and the second region R2 may emit light. The second region R2 may be any one of a plurality of sub-regions Ra, Rb, Rc, and Rd according to an angle of view smaller than a reference or a zoom magnification. The region corresponding to the angle of view and the zoom magnification smaller than the reference may be each of the sub-regions Ra, Rb, Rc, and Rd set in the first, second, third, and fourth examples described above. As shown in FIGS. 11 and 12, the second region R2 may implement any one of the plurality of sub-regions Ra, Rb, Rc, and Rd. Here, the second emitter disposed on the second light emitting portion E2 may include M rows and N columns, the M rows may include at least 8 rows, and the N columns may include at least 4 columns. For example, according to Examples 1 to 4, M rows may be 8 to 20 rows, and N (N<M) columns may be 4 to 15 columns smaller than 18 columns. The second emitters may be arranged in the same column for each adjacent row or arranged in a zigzag manner. The first emitter may include rows O and columns P, and rows O (O>M, O>N) may have at least 30 rows, and columns P (P>M, P>N) may have at least 15 columns, may be arranged in a matrix manner, or may be arranged in a zigzag form. Here, when only the second emitters in the second region R2 are arranged, the first emitters may be arranged at the same pitch according to rows and columns. And, the number of rows and columns may have a relationship of O>P>M>N.

The area of the sub-region Ra may be 30% or less, for example, in the range of 4% to 25% within the area of the first region R1. The sub-region Ra may be the size of the second region R2 in FIG. 2. Here, the sub-regions Ra may have the same length in the first direction from the central positions of the first and second regions R1 and R2 and may have the same length in the second direction. As a first example, when the sub-region Ra has an area of 25%±2% of the total area, the angle of view by the light irradiated by the second light emitting portion E2 may be provided in the range of 40 degrees to 50 degrees (see FIG. 12(A)). As a second example, when the sub-region Rb has an area of 11%±1.5% of the total area, the angle of view by the light irradiated by the second light emitting portion E2 may be provided in the range of 25 degrees to 35 degrees (see FIG. 12(B)). As a third example, when the sub-region Rc has an area of 6%±1% of the total area, the angle of view by the light irradiated by the second light emitting portion E2 may be provided in the range of 20 degrees to 25 degrees (see FIG. 12(C)). As a fourth example, when the sub-region Rc has an area of 4%±1% of the total area, the angle of view by the light irradiated by the second light emitting portion E2 may be provided in the range of 15 degrees to 23 degrees (see FIG. 12(D)). Here, the total area may be the area of the first region R1.

In the first example, the total number of the second emitters 202 of the second light emitting portion E2 may be 25% or less of the total number of the first emitters 201, for example, in the range of 20% to 25%. In the second example, the total number of the second emitters 202 of the second light emitting portion E2 may be 15% or less of the total number of the first emitters 201, for example, in the range of 9% to 15%. In the third example, the total number of the second emitters 202 of the second light emitting portion E2 may be 8% or less, for example, in the range of 4% to 8% of the total number of the first emitters 201. Here, the total number of the first emitters 201 may be 450 or more, for example, in the range of 450 to 1000, and the number of the second emitters 202 may be at least 20 or more. According to the first to fourth examples, the number of second emitters 202 may be calculated and disposed. In the fourth example, the total number of the second emitters 202 of the second light emitting portion E2 may be 6% or less, for example, in the range of 2% to 6% of the total number of the first emitters 201. The sub-regions Ra, Rb, Rc, and Rd of the second region R2 may be provided according to a zoom magnification and an angle of view according to any one of the first to fourth examples. According to the first example, the light from the second light emitting portion E2 may be provided in a zoom mode of 2 times compared to the reference multiple 1×, and according to the second example, the light from the second light emitting portion E2 may be provided in zoom mode of 3 times compared to the reference multiple, and according to the third example, the light of the second light emitting portion E2 may be provided in a zoom mode of 4 times the reference multiple, or according to the fourth example, the light from the second light emitting portion E2 may be provided in a zoom mode of 5 times compared to the reference multiple.

Here, when only the second light emitting portion E2 is driven according to the first example, power consumption of 5.8%±1.2% is saved compared to the power consumption of the first light emitting portion E1, and when only the second light-emitting unit E2 is driven according to the second example, power consumption of 2.9%±0.5% is saved compared to the power consumption of the first light emitting portion E1, and when only the second light emitting portion E2 is driven according to the third example, power consumption of 1.7%±0.3% is saved compared to the power consumption of the first light emitting portion E1, or when only the second light emitting portion E2 is driven according to the first example, the power consumption of 1%±0.2% may be saved compared to the power consumption of the first light emitting portion E1. As described above, by driving the light emitting portions E1 and E2 to the first region R1 and/or the second region R2, light according to different angles of view and different zoom magnifications may be provided. In addition, power consumption may be reduced by up to 6% compared to the case in which the second region R2 is not provided.

Figure 14:
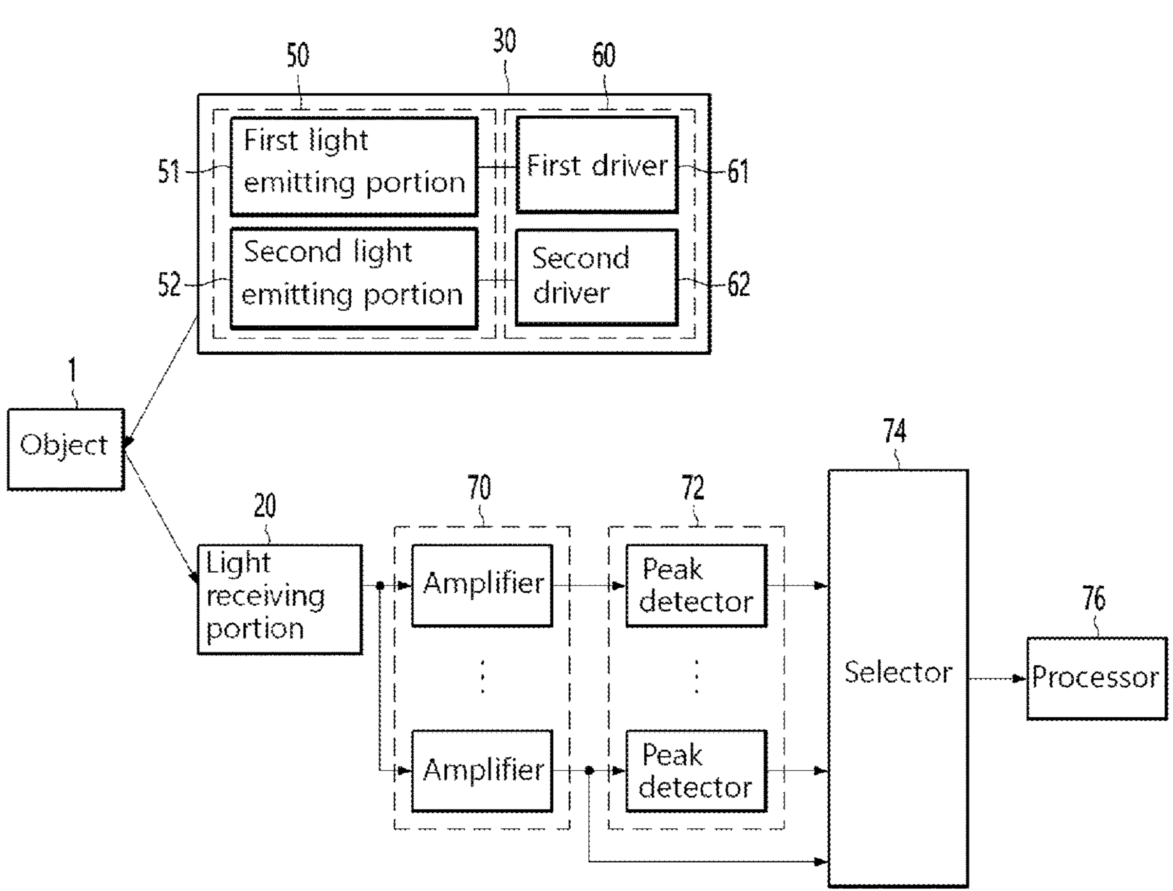
FIG. 14 is a block diagram of a distance measurement device according to an embodiment of the invention.

As shown in FIG. 14, the distance measurement device may include a light source 30, a light receiving portion 20, a plurality of amplifiers 70, a peak detector 72, a selector 74, and a processor 76. As shown in FIGS. 2 to 10 disclosed above, the light source 30 may radiate light toward the object 1 through the first and second light emitting portions 51 and 52 having the sub-regions Ra, Rb, Rc and Rd of the first region R1 and/or the second region R2. The light source 30 may include a driver 60 having a first driver 61 for driving the first light emitting portion 51 and a second driver 62 for driving the second light emitting portion 52. The first and second drivers 61 and 62 may be implemented as driver ICs. A description of overlapping contents of the light source 30 will be omitted.

The light receiving portion 20 may detect light reflected or scattered from the object 1 and output an electrical signal. The light receiving portion 20 may detect the scattered light and output an electrical signal. The light receiving portion 20 may convert reflected or scattered light into a voltage signal. The plurality of amplifiers 70 may generate a plurality of amplified electrical signals by amplifying the electrical signal with different gains, respectively. The plurality of amplifiers 70 may have different gain values from a low gain value to a high gain value. The plurality of peak detectors 72 may detect a peak for each of the amplified signals to generate a peak detection signal, and each of the peak detectors 72 may detect the center position of the amplified electrical signal, thereby detecting the peak. The selector 74 may select an optimal peak detection signal based on the level of at least one amplified electric signal among the plurality of amplified electric signals. The processor 76 may control the operation of each component of the distance measurement device. The distance measurement device may include a memory in which programs and other data for operations performed by the processor 76 are stored. The processor 76 may include a time to digital converter (TDC) for measuring the time between the irradiation time of the light irradiated from the first and/or second light emitting portions 50 (i.e., 51 and 52) of the light source 30 and the detection time of the peak detected by the peak detector 74, and the processor 76 may measure the distance to the object 1 based on the time measured by the TDC. According to another embodiment, the processor 76 may include an analog digital converter (ADC) that converts a peak that is an analog signal into a digital signal, and the processor 76 may measure the distance to the object 1 by processing the digital signal converted by the ADC.

Figure 15:
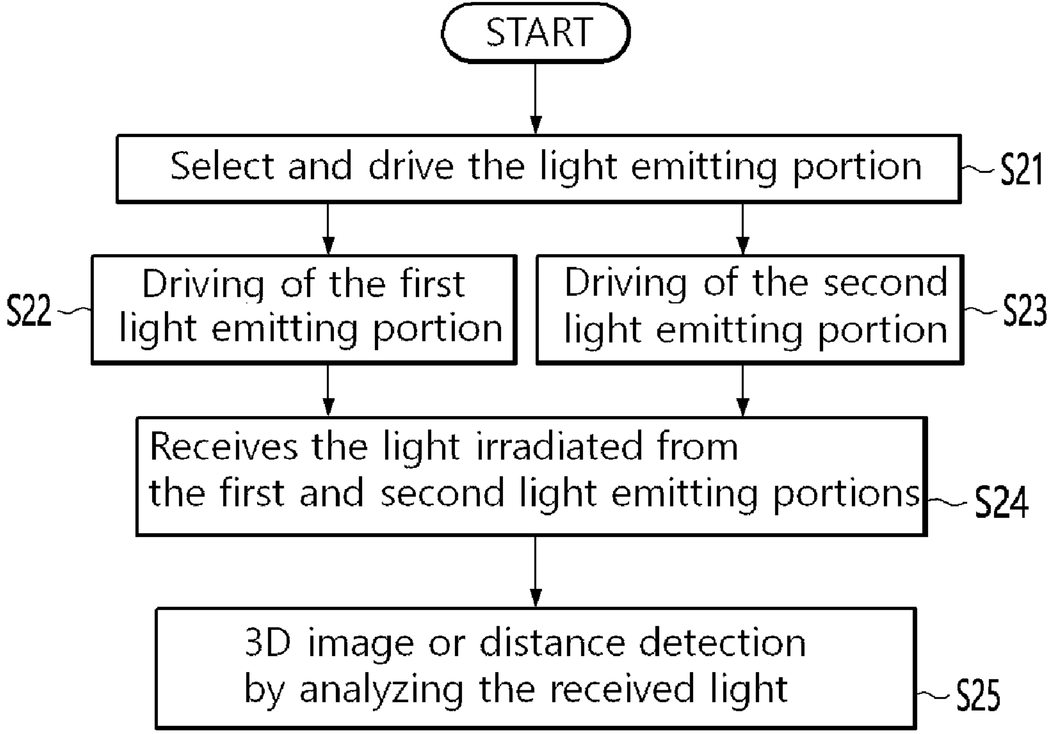
FIG. 15 is an example of a flowchart of a distance measurement device according to an embodiment of the invention.

As shown in FIG. 15, the surface-emitting laser device may select any one or both of the first and second light emitting portions (S21), and the selected light emitting portion is driven by the first and second driving portions (S22), and the infrared light may be irradiated towards the object. Thereafter, the light receiving portion receives the light irradiated by the first and/or second light emitting portion (S24), and analyzes the received light to detect a 3D image or distance. In this case, when the second light emitting portion is driven, light for a magnification higher than the reference magnification, that is, 2 magnification or more and smaller than the reference angle of view, for example, light for an angle of view of less than 80 degrees may be irradiated. Accordingly, the 3D image or distance corresponding to the object may be measured by the light received by the light receiving portion. Accordingly, power consumption at the zoom magnification may be reduced compared to the case of the reference mode (reference angle of view, reference magnification).

Figure 16:
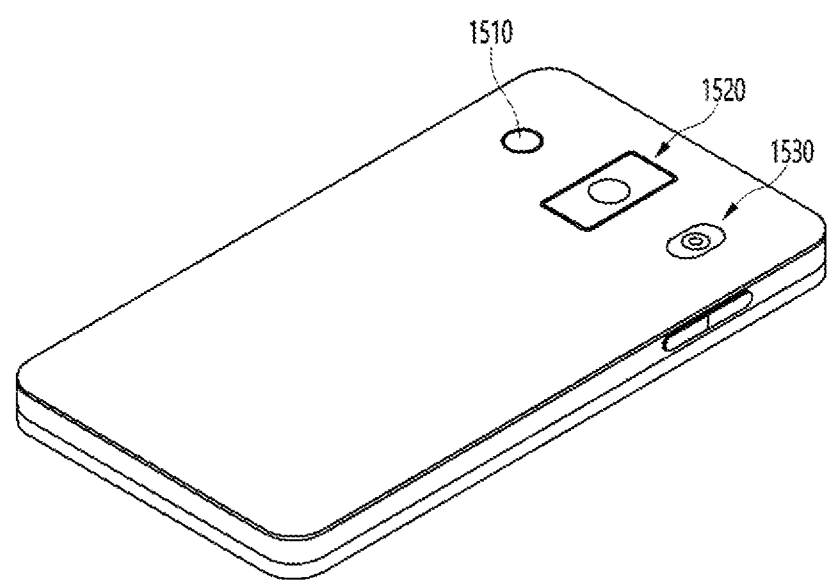
FIG. 16 is an example of a portable terminal coupled with a distance measurement device according to an embodiment of the invention.

FIG. 16 is a perspective view illustrating an example of a mobile terminal to which a surface-emitting laser device according to an embodiment of the invention is applied.

As shown in FIG. 16, the mobile terminal 1500 may include a camera module 1520, a flash module 1530, and an autofocus device 1510 provided on one or the rear side. Here, the autofocus device 1510 may include the above-described surface-emitting laser device and a light receiving portion as a light emitting layer. The flash module 1530 may include an emitter emitting light therein. The flash module 1530 may be operated by a camera operation of a mobile terminal or a user's control. The camera module 1520 may include an image capturing function and an auto focus function. For example, the camera module 1520 may include an auto-focus function using an image. The autofocus device 1510 may include an autofocus function using a laser. The autofocus device 1510 may be mainly used in a condition in which the auto focus function using the image of the camera module 1520 is deteriorated, for example, in proximity of 10 m or less or in a dark environment. The above detailed description should not be construed as restrictive in all respects and should be considered as illustrative. The scope of the embodiments should be determined by a reasonable interpretation of the appended claims, and all modifications within the equivalent scope of the embodiments are included in the scope of the embodiments.

The invention claimed is:

1. A surface-emitting laser device comprising:

a first region in which a first subset of a plurality of first emitters are arranged;

a second region in which a second subset of the plurality of first emitters and a plurality of second emitters are arranged;

a first pad disposed outside the first region and electrically connected to the plurality of first emitters of the first and second regions; and a second pad disposed outside the first region and electrically connected to the plurality of second emitters, wherein an area of the second region is 30% or less of an area of the first region, wherein the second region is disposed in a center region at least partially surrounded by the first region, wherein a first emitter among the plurality of first emitters and a second emitter among the plurality of second emitters are separately driven, wherein the plurality of second emitters in the second region are arranged in a first direction and a second direction orthogonal to each other, wherein the second subset of the plurality of first emitters in the second region are arranged in the first direction and the second direction, wherein each second emitter of the plurality of second emitters is disposed between adjacent first emitters of the second subset arranged in the first and second directions in the second region, and wherein a pitch in the first direction between adjacent first emitters of the second subset in the second region is the same as a pitch in the second direction between adjacent second emitters of the plurality of second emitters in the second region.

2. The surface-emitting laser device of claim 1, wherein a number of the plurality of second emitters disposed in the second region is smaller than a number of the first subset of first emitters disposed in the first region.

3. The surface-emitting laser device of claim 1, wherein a pitch in the first and second directions between adjacent first emitters of the first subset in the first region is the same as a pitch in the first and second directions between adjacent second emitters of the plurality of second emitters in the second region.

4. The surface-emitting laser device of claim 3, wherein adjacent first emitters in the first region and adjacent second emitters in the second region have a same pitch.

5. The surface-emitting laser device of claim 1, wherein each first emitter of the plurality of first emitters and each second emitter of the plurality of second emitters includes a respective light emitting layer disposed on a respective lower first reflective layer, an oxide layer having an opening on the respective light emitting layer, a respective second reflective layer on the oxide layer, and a respective passivation layer on the respective second reflective layer, wherein each first emitter of the plurality of first emitters includes a respective first electrode including a respective first contact portion contacted on the respective second reflective layer of the first emitter, and a respective first connection portion extending from the respective first contact portion to the respective passivation layer, and wherein each second emitter of the plurality of second emitters includes a respective second electrode comprising a respective second contact portion contacted on the respective second reflective layer of the second emitter, and a respective second connection portion extending from the respective second contact portion to the respective passivation layer, wherein the surface-emitting laser device includes a first insulating layer disposed between the respective first connection portions and the respective second connection portions on the second region, and wherein the second pad is disposed on an outer portion of the first region with an area smaller than that of the first pad and is electrically connected to the plurality of second emitters.

6. The surface-emitting laser device of claim 5, comprising:

a first flat portion disposed between protruding portions of the second subset of first emitters and the plurality of second emitters in the second region, wherein the protruding portions of the plurality of first and second emitters include the respective light emitting layer, the oxide layer, and the respective second reflective layer, wherein a portion of the first flat portion is vertically overlapped with the respective first connection portion of the respective first electrode and the respective second connection portion of the respective second electrode.

7. The surface-emitting laser device of claim 6, further comprising: a third region in which a bridge electrode connecting the respective second electrode to the second pad is disposed between the second region and the second pad, wherein the bridge electrode extends outside the protruding portions of a third subset of first emitters disposed in the third region, and the third region includes a second flat portion extending outside the protruding portions of the third subset of first emitters, wherein the respective first connection portion of the respective first electrode and the bridge electrode of the respective second electrode overlap on the second flat portion in a vertical direction, and wherein the first insulating layer is disposed between an upper surface of the respective first connection portion of the respective first electrode and a lower surface of the bridge electrode, wherein the surface-emitting laser device includes a second insulating layer for protecting an outer portion of the bridge electrode of the first electrode.

8. The surface-emitting laser device of claim 5, wherein a total number of the plurality of second emitters is in a range of 20% to 25% of a total number of the plurality of first emitters in the first and second regions.

9. A surface-emitting laser device comprising:

a first light emitting portion having rows O and columns P and in which a first subset of a plurality of first emitters irradiating light in an infrared region are arranged;

at least one second light emitting portion having M rows and N columns and in which a second subset of the plurality of first emitters and a plurality of second emitters for irradiating light in the infrared region are arranged, a first pad disposed outside the first light emitting portion and electrically connected to the plurality of first emitters of the first and second light emitting portions; and a second pad disposed outside the first light emitting portion and electrically connected to the plurality of second emitters, wherein an area of the second light emitting portion in which the plurality of second emitters are disposed is smaller than an area of the first light emitting portion, wherein a number of the plurality of second emitters disposed in the second light emitting portion is smaller than a number of the first subset of first emitters disposed in the first light emitting portion, wherein the second light emitting portion is disposed in a center region at least partially surrounded by the first light emitting portion, wherein a first emitter among the plurality of first emitters and a second emitter among the plurality of second emitters are driven separately, wherein O, P, M, N are integers, and have a relationship of O>P>M>N, wherein the plurality of first emitters in the first and second light emitting portions are arranged in first and second directions orthogonal to each other, wherein the second subset of the plurality of first emitters and the plurality of second emitters in the second light emitting portion are arranged in the first and second directions, wherein a pitch in the first and second directions between an adjacent first emitter of the second subset and a second emitter of the plurality of second emitters is smaller than a pitch in the first and second directions between adjacent first emitters of the first subset, and wherein an angle of view of the first light emitting portion and an angle of view of the second light emitting portion are different from each other.

10. The surface-emitting laser device of claim 9, wherein the first light emitting portion irradiates light for a reference angle of view, and wherein the second light emitting portion irradiates light for an angle of view smaller than the reference angle of view.

11. The surface-emitting laser device of claim 10, wherein the angle of view of the first light emitting portion is 70 degrees or more, and wherein the angle of view of the second light emitting portion is 50 degrees or less.

12. The surface-emitting laser device of claim 10, wherein each first emitter of the plurality of first emitters and each second emitter of the plurality of second emitters are repeatedly turned on/off with a predetermined cycle, and wherein a driving period of each first emitter of the plurality of first emitters at the reference angle of view is smaller than a driving period of each second emitter of the plurality of second emitters at the angle of view smaller than the reference angle of view.

13. The surface-emitting laser device of claim 9, wherein the area of the second light emitting portion is 30% or less of the area of the first light emitting portion, and wherein the second light emitting portion is arranged in a polygonal shape with respect to a center of the first and second light emitting portions.

14. The surface-emitting laser device of claim 9, wherein the second light emitting portion has the plurality of second emitters configured for a 2× zoom magnification or more.

15. The surface-emitting laser device of claim 9, wherein a total number of the plurality of second emitters is in a range of 20% to 25% of a total number of the plurality of first emitters in the first and second light emitting portions.

* * * * *